(12) United States Patent
Liu et al.

(10) Patent No.: US 11,916,551 B2
(45) Date of Patent: *Feb. 27, 2024

(54) PROCESS OF ROUTING TILE-TO-TILE INTERCONNECTS OF AN FPGA, AND METHOD OF MANUFACTURING AN FPGA

(71) Applicant: Flex Logix Technologies, Inc., Mountain View, CA (US)

(72) Inventors: Yongning Liu, San Ramon, CA (US); Fan Mo, San Jose, CA (US); Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 17/676,123

(22) Filed: Feb. 19, 2022

(65) Prior Publication Data
US 2022/0173738 A1    Jun. 2, 2022

Related U.S. Application Data

(62) Division of application No. 17/106,124, filed on Nov. 29, 2020, now Pat. No. 11,277,135, which is a division of application No. 16/579,766, filed on Sep. 23, 2019, now Pat. No. 10,855,284.

(60) Provisional application No. 62/735,988, filed on Sep. 25, 2018.

(51) Int. Cl.
*H03K 19/17736*    (2020.01)
*H03K 19/17796*    (2020.01)
*H03K 19/17732*    (2020.01)

(52) U.S. Cl.
CPC . *H03K 19/17744* (2013.01); *H03K 19/17732* (2013.01); *H03K 19/17796* (2013.01)

(58) Field of Classification Search
None
See application file for complete search history.

(56) References Cited

U.S. PATENT DOCUMENTS

| 6,433,580 | B1 | 8/2002 | Ting |
| 6,608,500 | B1 | 8/2003 | Lacey |
| 7,212,030 | B1 | 5/2007 | Hecht |
| 10,855,284 | B1 | 12/2020 | Liu et al. |
| 11,277,135 | B2 | 3/2022 | Liu et al. |
| 11,336,287 | B1 * | 5/2022 | Rodriguez .......... G06F 15/7825 |

(Continued)

*Primary Examiner* — Jany Richardson
(74) *Attorney, Agent, or Firm* — Charles Shemwell

(57) ABSTRACT

A method of routing interconnects of a field programmable gate array including: a plurality of logic tiles, and a tile-to-tile interconnect network, having a plurality of tile-to-tile interconnects to interconnect logic tile networks of the logic tiles, the method comprises: routing a first plurality of tile-to-tile interconnects in a first plurality of logic tiles. After routing the first plurality of tile-to-tile interconnects, routing a second plurality of tile-to-tile interconnects in a second plurality of logic tiles. The start/end point of each tile-to-tile interconnect in the first plurality and the second plurality of tiles is independent of the start/end point of the other tile-to-tile interconnects in the first and second plurality, respectively. Routing the second plurality of tile-to-tile interconnects includes connecting at least one start/end point of each tile-to-tile interconnect in the second plurality of tiles to at least one start/end point of each interconnect in the first plurality of tiles.

20 Claims, 34 Drawing Sheets

(56) References Cited

U.S. PATENT DOCUMENTS

2004/0268286 A1  12/2004  New
2007/0244960 A1  10/2007  Schmit
2008/0238477 A1  10/2008  Feng
2019/0286987 A1   9/2019  Lie

* cited by examiner

PROCESS OF ROUTING TILE-TO-TILE INTERCONNECTS OF AN FPGA, AND METHOD OF MANUFACTURING AN FPGA

RELATED APPLICATION

This application is a divisional of U.S. Non-Provisional application Ser. No. 17/106,124, filed Nov. 20, 2020 (still pending), which is a divisional of U.S. Non-Provisional application Ser. No. 16/579,766, filed Sep. 23, 2019 (U.S. Pat. No. 10,855,284). This application, the '124 application and the '766 application claim priority to and the benefit of U.S. Provisional Application No. 62/735,988, filed Sep. 25, 2018. The '124, '766 and '988 applications are incorporated herein by reference in their entirety.

INTRODUCTION

In one aspect, the present inventions are directed to a routing technique of interconnects of the tile-to-tile interconnect network of an integrated circuit including a field programmable gate array (FPGA) disposed therein/thereon (hereinafter collectively "therein"), and method of manufacturing and operating an FPGA, wherein the FPGA includes programmable/configurable logic circuitry having an array or a plurality of tiles, each having programmable circuitry or components (notably "tiles" are often referred to as "logic cells", "configurable logic blocks" (CLBs), "logic array blocks" (LABs), or "logic tiles"—hereinafter collectively referred to as "logic tiles"). The tile-to-tile interconnect network provides for and/or facilitates communications between circuitry in one or more (or all) of the logic tiles and circuitry in one or more (or all) other logic tiles (i.e., tile-to-tile communications).

For example, in one embodiment, the FPGA includes a plurality of logic tiles each logic tiles including circuitry such as, for example, one or more computing elements (e.g., processor circuit (e.g., a data process or digital signal processor), controller circuit, an accelerator, a data encryption engine, a filter, an encoder, a state machine and/or combinational logic circuit), and a logic tile interconnect network (e.g., a mixed-mode interconnect network (i.e., a hierarchical switch matrix interconnect network and a mesh, torus or the like interconnect network (hereinafter collectively "mesh network" or "mesh interconnect network")). The logic tile interconnect networks of the logic tiles are interconnected via tile-to-tile interconnects of a tile-to-tile interconnect network (e.g., a mesh interconnect network) wherein a plurality of tile-to-tile interconnects provide communications between, for example, the one or more switch matrices of the logic tile interconnect networks of the logic tiles of the FPGA. The routing processes or techniques of the present inventions may provide an accelerated, efficient and rapid manner of routing interconnects of the tile-to-tile interconnect network to establish or provide a desired interconnect architecture or layout of the tile-to-tile interconnect network to provide communications between one or more circuitry (e.g., computing elements) in one or more (or all) of the logic tiles and one or more computing elements in one or more (or all) other logic tiles (i.e., tile-to-tile communications) of the FPGA.

In addition thereto, the process or technique of the present inventions may further include processes or techniques for routing the interconnects within the logic tiles such that a more complete communication path is routed from, for example, a computing element in a first logic tile to, for example, a computing element in a second logic tile via the logic tile interconnect networks in each of the first and second logic tiles and the tile-to-tile interconnect network. In this way, the processes or techniques of the present inventions provides an "end-to-end" interconnect architecture or layout including connection of circuitry (e.g., one or more computing elements (e.g., a data process or digital signal processor, controller circuit, an accelerator, a data encryption engine, a filter, an encoder, a state machine and/or combinational logic circuit)) to/through the respective logic tile interconnect networks of the first and second logic tiles as well as the tile-to-tile interconnect network disposed between and connecting the logic tile interconnect networks of the first and second logic tiles.

In one embodiment of the present inventions, the routing technique sequentially routes a plurality of partial interconnect paths wherein each partial interconnect path is associated with a subset or group of logic tiles where the start/end point(s) of the routing for, in or through each logic tile of the subset or group are independent of/from other start/end point(s) of the routing for, in or through the other logic tiles of the subset or group. For example, the logic tiles of a subset or group of logic tiles may be non-contiguous logic tiles of an array of logic tiles (e.g., the black/red squares of a checkerboard). The start/end point(s) of the routing for, in or through each of the non-contiguous logic tiles are independent of each other. That is, the start/end point(s) of the routing of an interconnect path for, in or through each logic tile of the group of non-contiguous logic tiles may be determined, defined or routed simultaneously and/or independently of the routing for the subset or group.

The routing for, in or through logic tiles of subsets or groups of non-contiguous logic tiles, while independent of each other, may depend on the start/end point(s) of the routing for, in or through logic tiles of other subsets or groups. For example, a routing technique according to the present inventions may start with routing or determining a first partial interconnect path for a first group of logic tiles (i.e., a first subset) wherein the start/end point(s) of the routing of the first partial interconnect path within each logic tile of the first group is independent from start/end point(s) of the routing of the first partial interconnect path for the other logic tiles of the first group. Thereafter, the routing technique of the present inventions route or determine a second partial interconnect path for a second group of logic tile(s) wherein the start point of the routing of the second partial interconnect path within each logic tile of the second group correlates or connects to the end of the interconnect path routed in or through each of logic tile of the first group that is/are adjacent thereto. The start/end point(s) of the routing of the second partial interconnect path for, in or through each logic tile of the second group may be determined simultaneously and/or independently of the routing for, in or through each other logic tile of the second group. Here, however, as intimated above, start/end point(s) of the routing of the second partial interconnect path for the logic tiles of the second group may depend on the start/end point(s) of the first partial interconnect path routed in or through each of logic tile of the first group because the start/end point(s) of the routing of the second partial interconnect path for the logic tiles of the second group may connect to the interconnect path routed for, in or through logic tile(s) of the first group. The processes of the present inventions may be repeated until the entire tile-to-tile interconnect path for a given route between the plurality of logic tiles is determined, defined or complete (i.e., all partial interconnect paths are routed wherein the plurality of partial interconnect paths, when interconnected, to form a complete tile-to-tile interconnect path or route between a plurality of logic tiles).

Notably, the interconnect path of the tile-to-tile interconnect network, routed according to the present inventions, includes the one or more switches of the tile-to-tile interconnect network and/or one or more switches of the logic tile interconnect network of each logic tile associated with or included in the interconnect path or route. Thus, in addition to tile-to-tile interconnects, the interconnect path includes one or more switches of the tile-to-tile interconnect network of each logic tile associated with or included in that interconnect path or route.

As mentioned above, in one embodiment, in addition to routing the interconnect path of the tile-to-tile interconnect network, the processes of the present inventions may route the entire interconnect path—that is, end-to-end (e.g., from a computing element in a first logic tile to a computing element in a second logic tile) for a given route between the plurality of logic tiles (interconnect path in the logic tile interconnect network of each logic tile and the interconnect path of the tile-to-tile interconnect network).

The present inventions may be employed to program, route and/or configure each of the tile-to-tile interconnects of one or more (or all) of the logic tiles of an FPGA, in parallel (concurrently or substantially concurrently) or sequentially. Moreover, the present inventions may be employed to program, route and/or configure the entire interconnect path in an end-to-end manner including, for example, between a computing element in a first logic tile (via the associated logic tile interconnect network of the first logic tile) and a computing element in a second logic tile (via the associated logic tile interconnect network of the second logic tile) through the tile-to-tile interconnects of the tile-to-tile interconnect network of the FPGA.

In one embodiment, in the event of a conflict, obstruction, impasse, congestion and/or the like (hereinafter, collectively "congestion" or "conflict") of a given routing of the interconnect path, the technique may include one or more re-route steps which re-route(s) previously routed partial interconnect paths and repeats one or more earlier routing steps (described above) for any portions of the partial interconnect paths that, for example, has conflict, obstruction, blockage, and/or congestion (e.g., (i) do not include interconnect between logic tiles or in one or more logic tiles that provide or allow the entire interconnect path to be sufficiently routed for a given route between logic tiles and/or (ii) a defined route is not efficient or in accordance with/to specification(s) (e.g., signal timing specifications).

As mentioned above, the routing process of the present inventions may program, route and/or configure each of the tile-to-tile interconnects for one or more (or all) of the logic tiles sequentially or in parallel using the techniques of the present inventions. Moreover, in one embodiment, the routing processes of the present inventions may program, route and/or configure all interconnects associated with one logic tile, a plurality of logic tiles (e.g., group or subset of logic tiles) or all of the logic tiles in parallel or sequentially. For example, the interconnect paths of the inventive routing processes (including the tile-to-tile interconnects and the logic tile interconnects associated with such computing elements), as described herein, may be defined or routed (e.g., between computing elements of logic tiles) sequentially or in parallel on an interconnect path basis, tile-by-tile basis, group or subset of tiles basis (e.g., the routing for all interconnects for the group or subset of logic tiles are defined or routed in parallel), and/or a circuitry (e.g., computing element) basis.

Briefly, an FPGA may be configured and/or reconfigured (hereinafter, unless stated otherwise, collectively "configured" or the like (e.g., "configure", "configuring" and "configurable")) by a user, customer and/or a designer before and/or after manufacture. The FPGA includes, among other things, a plurality of logic tiles wherein each logic tile includes a logic tile interconnect network of configurable interconnects that facilitate communication within the logic tile. (See, e.g., FIGS. 1A, 1B and 1C). In addition, the FPGA includes tile-to-tile interconnects that interconnect the logic tile interconnect network of each logic tile thereby providing communication between the logic tiles. (See, e.g., FIG. 1C). The logic tile interconnect network of each logic tile may include a plurality of switch matrices (e.g., an M×N switch matrix) arranged in a plurality of switch matrix stages or switch matrices stages (below, at times, "SM stage" or "SM stages") which are interconnected into a logic tile interconnect network via logic tile interconnects. (See, for example, FIG. 1D—see also, for example, the interconnect networks described and/or illustrated in U.S. Pat. No. 9,503,092, which are incorporated herein by reference). As such, one or more (or all) logic tiles are configurable to communicate, during operation of the integrated circuit, between computing elements within the logic tile as well as with at least one other logic tile of the FPGA.

Notably, the integrated circuit may be, for example, (i) a discrete processor, controller, state machine, gate array, system-on-chip (SOC), programmable gate array (PGA) and/or FPGA or (ii) an embedded processor, controller, state machine, gate array, SOC, PGA and/or FPGA.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

BRIEF DESCRIPTION OF THE DRAWINGS

The present inventions may be implemented in connection with embodiments illustrated in the attached drawings. These drawings show different aspects of the present inventions and, where appropriate, reference numerals or names illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

Figure 1A:
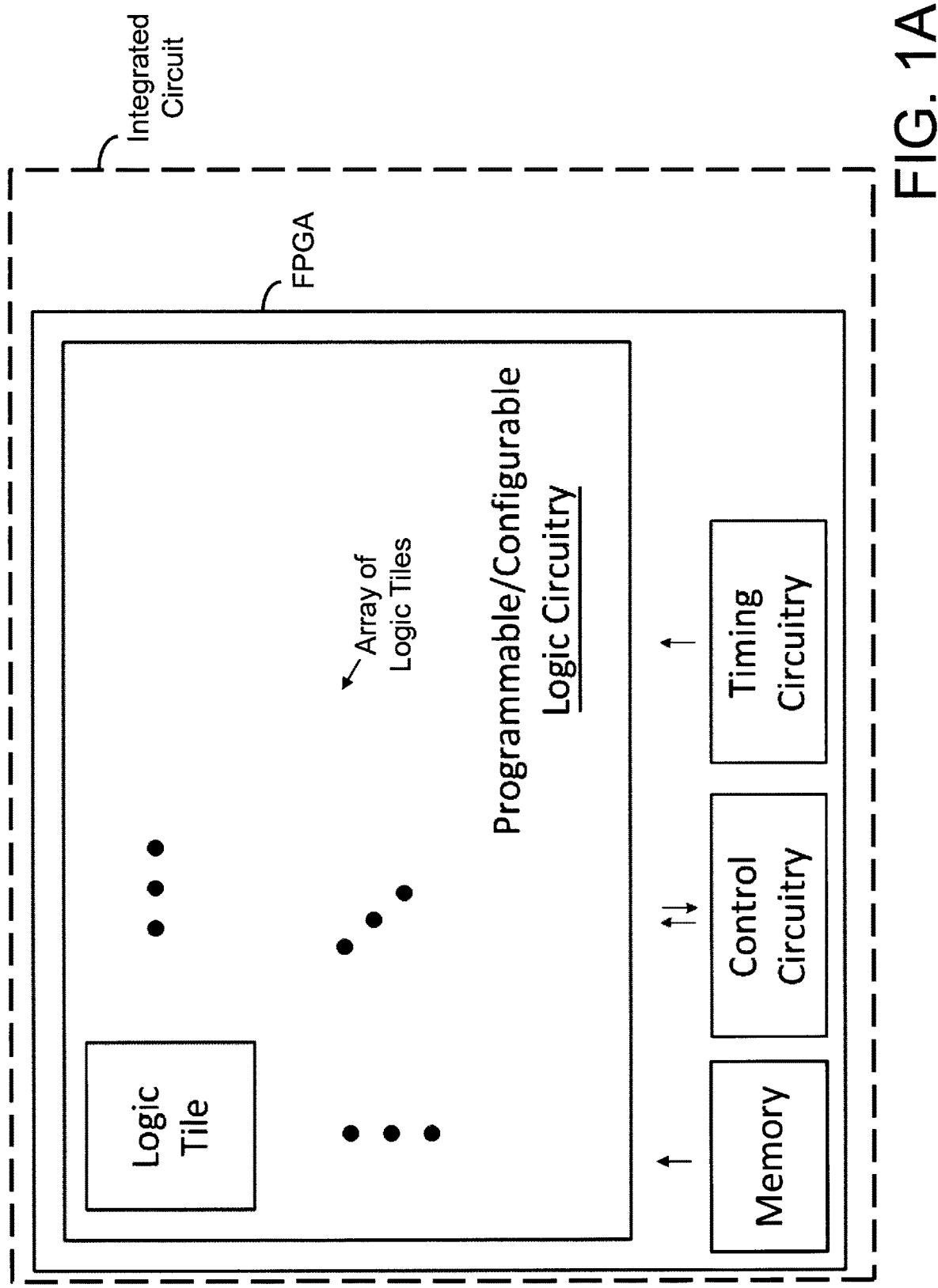
FIG. 1A illustrates a block diagram representation of, for example, an exemplary integrated circuit including control circuitry, timing or clock circuitry, power supply circuitry and programmable/configurable logic circuitry (which includes a plurality of logic tiles, each of which may include transistors configured to perform combinational and/or sequential functions (simple and/or complex) and transistors (that may be interconnected, for example, as multiplexers having two or more inputs which are electrically interconnected into a network (see, for example, the interconnect networks described and/or illustrated in U.S. Pat. No. 9,503,092; the '092 patent is incorporated herein by reference) as well as connected to, for example, associated data storage elements, input pins and/or lookup tables that, when programmed, determine the operation and connectivity of multiplexers/switches of the interconnect networks))
Figure 1B:
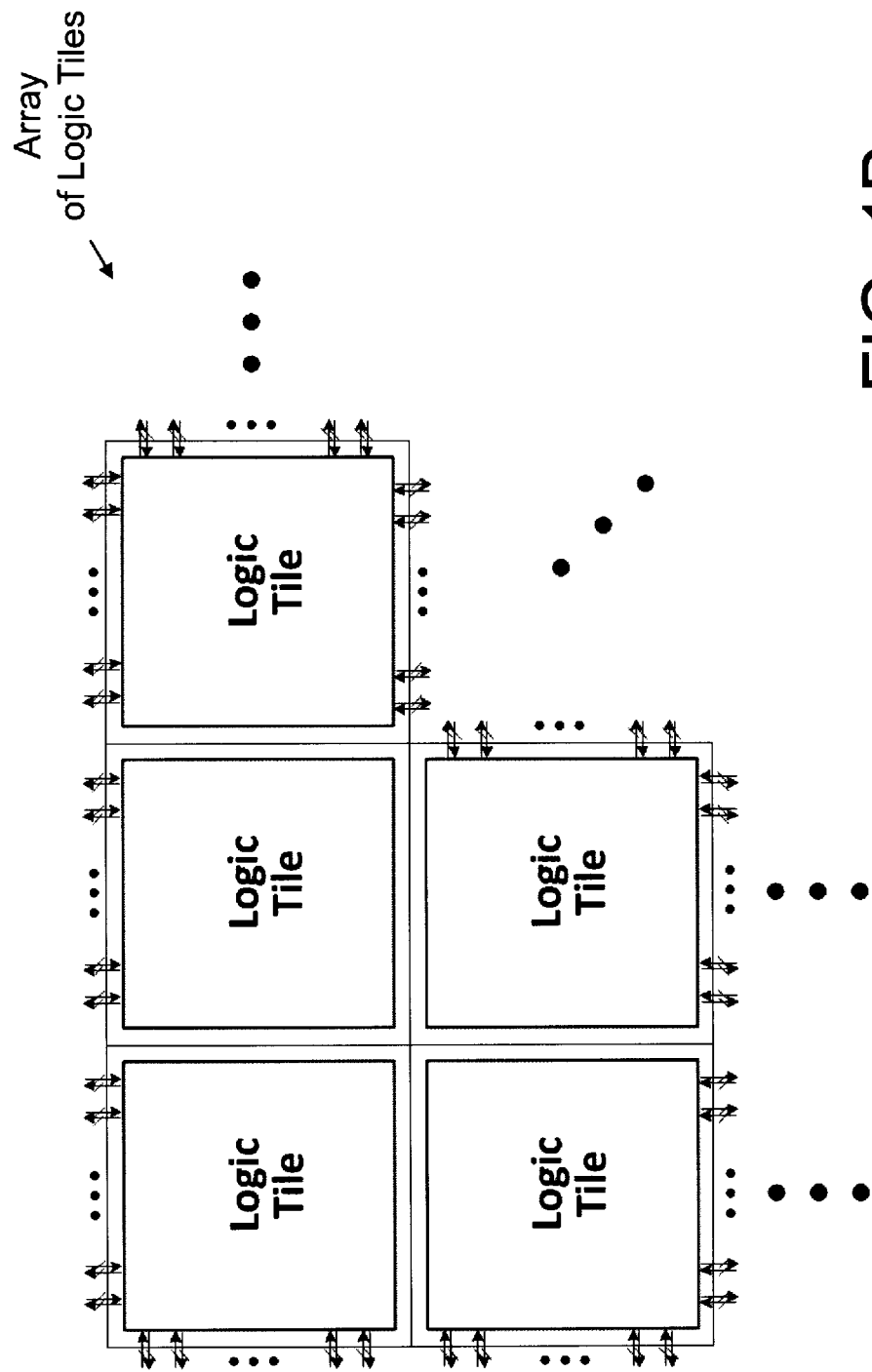
FIG. 1B illustrates, among other things, a block diagram representation of a plurality of logic tiles (arranged in an array) of, for example, an exemplary FPGA (again—which may be embedded or discrete), wherein input/output of the logic tiles may facilitate communication between the logic tiles and/or between certain logic tiles and circuitry external to the programmable/configurable logic circuitry; notably, the programmable/configurable logic circuitry may be comprised of a plurality of programmable logic tiles wherein each logic tile includes a plurality of multiplexers which are electrically interconnected into a network (e.g., a hierarchical network and/or mesh network); notably, the terms multiplexers and switches are used herein interchangeably even though a switch may consist of a plurality of multiplexers; the logic tile interconnects and tile-to-tile interconnects provide a predetermined or defined route or connection by controlling or programming selected inputs to the outputs of the switches or multiplexers of the logic tile interconnect network and tile-to-tile interconnect network.
Figure 1C:
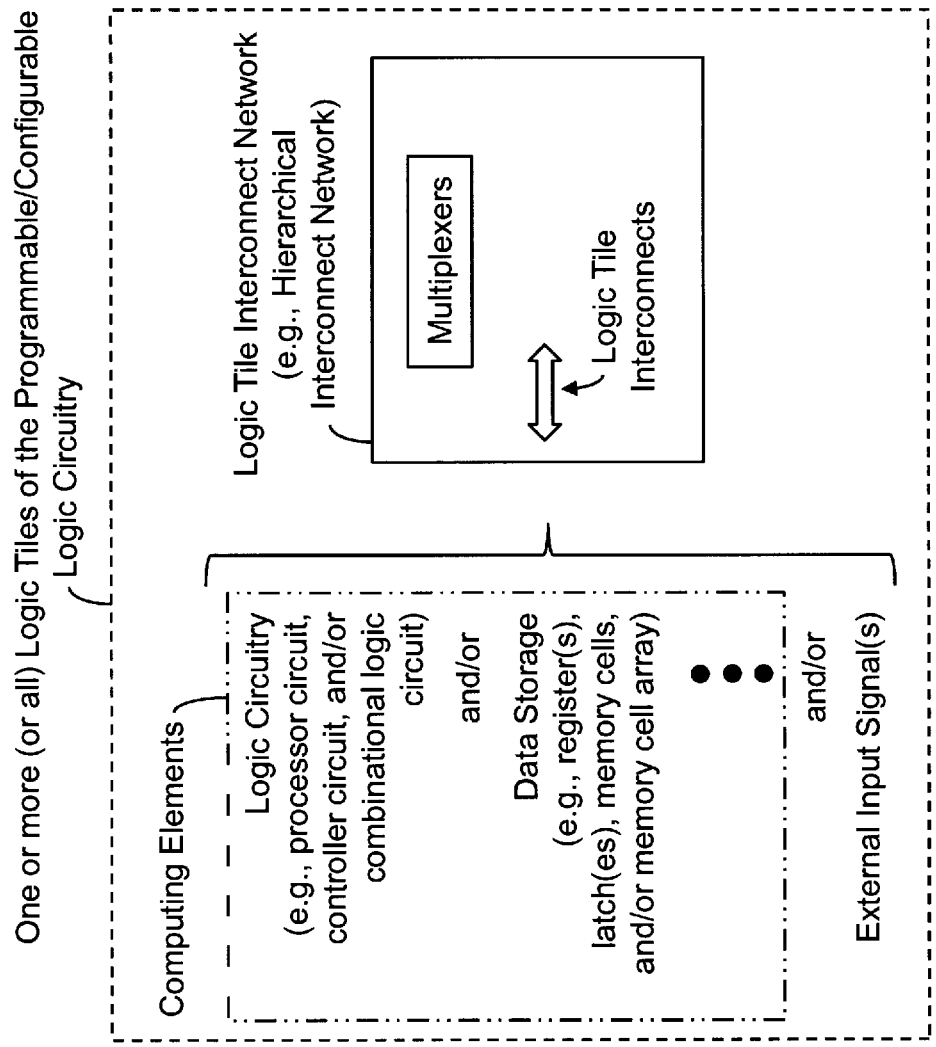
FIG. 1C illustrates a block diagram representation of the interconnect architecture of one or more (or all) of the logic tiles of the programmable/configurable logic circuitry which include computing elements interconnected via a logic tile interconnect network (e.g., a hierarchical interconnect network or a mixed-mode interconnect network) wherein a plurality (or all) logic tiles are interconnected via a tile-to-tile interconnect network (e.g., a mesh interconnect network wherein a plurality of switches of a stage of the logic tile interconnect network (e.g., the highest stage) are connected (via tile-to-tile interconnects) to a plurality of switches of a stage logic tile interconnect network (e.g., the highest stage) of one or more other logic tiles; notably, the tile-to-tile interconnects and/or logic tile interconnects may include uni-directional conductors and/or one bi-directional conductors.
Figure 1D:
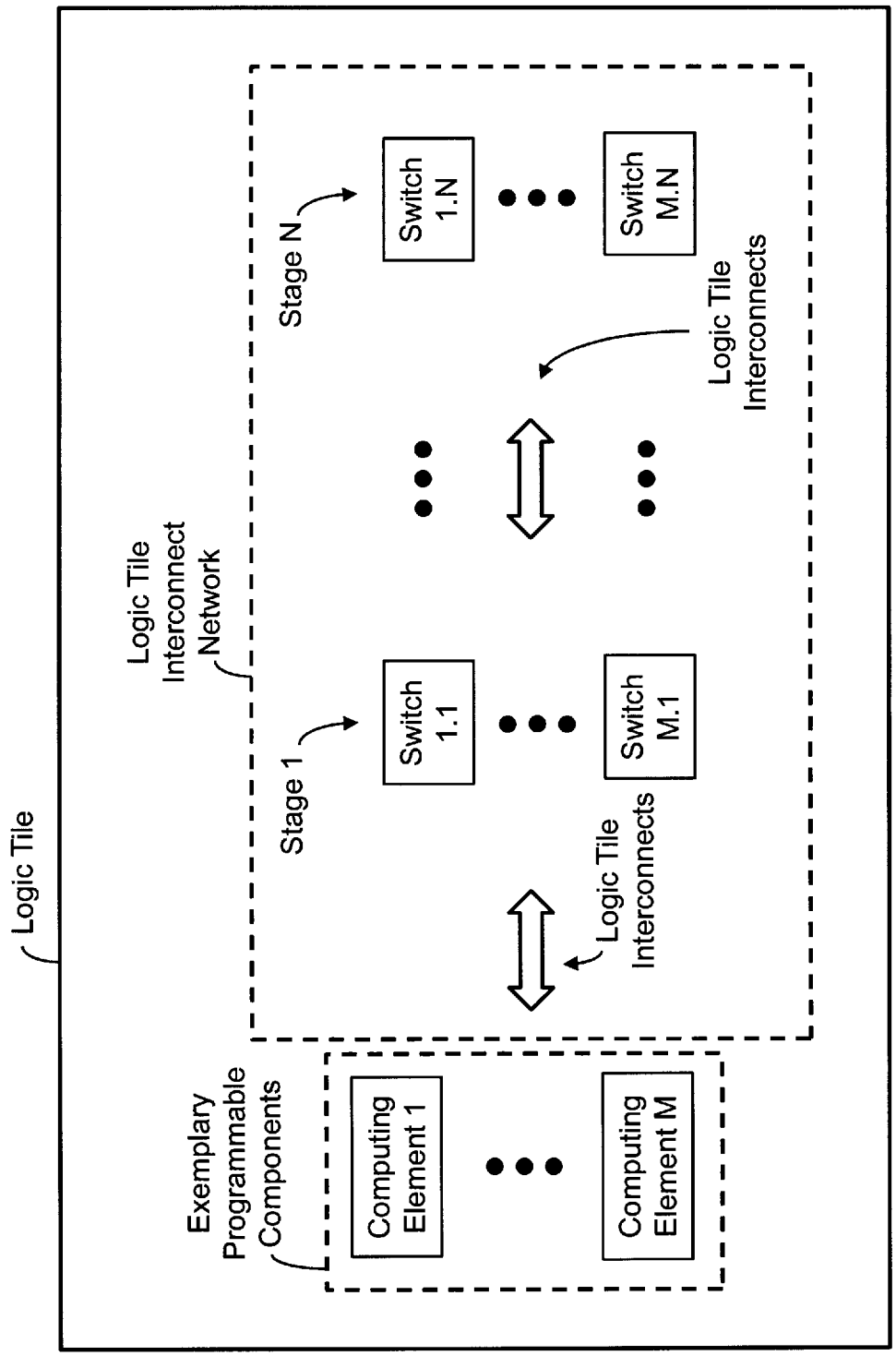
FIG. 1D illustrates a block diagram representation of an exemplary lotic tile interconnect network, including, in this exemplary embodiment, an M×N array of switch matrices (e.g., configured in a hierarchical and/or mesh network), without detailed illustration of interconnection, of an exemplary logic tile of the programmable/configurable logic circuitry of an FPGA; notably, the logic tile interconnects of this exemplary embodiment also connect to one or more circuitry, including one or more computing elements wherein, in this exemplary embodiment, one or more interconnects connecting the component(s) to the switches of stage 1; the interconnects provide a particular route by controlling or programming the switches of the switch matrices and thereby connecting a selected input of the switch (having a certain interconnect connected thereto) to an output of the switch; the data states of the signals applied to the control inputs of the switches which control or program the input selection (i.e., which input is connected to the output) may be stored in memory, for example, resident in the logic tile or external thereto.
Figure 2A:
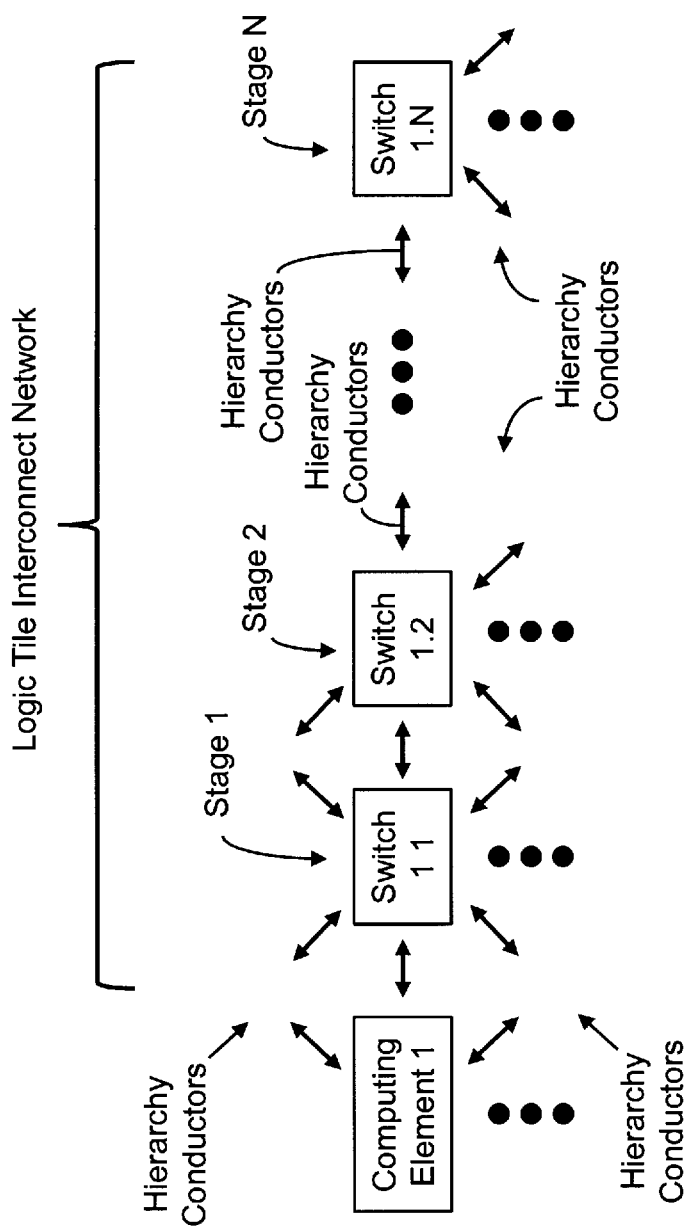
FIG. 2A illustrates a simplified exemplary schematic block diagram representation of a n exemplary switch interconnect architecture of a logic tile, according to at least one aspect of the logic tile interconnect network wherein the logic tile interconnect network is configured in a hierarchical network and connects to a plurality of computing elements (e.g., a plurality of I/O of a data process or digital signal processor, controller circuit, an accelerator, a data encryption engine, a filter, an encoder, a state machine and/or combinational logic circuit) wherein, in this illustrative embodiment, each computing element is associated with plurality of switch matrices (organized in switch matrix (SM) Stages) which are configured in hierarchical network (interconnected via hierarchy conductors), according to at least one aspect of the present inventions; notably, the switch matrices may include the same or different radices and may or may not be boundary-less; each bidirectional wire or conductor may be a single conductor or two sets of unidirectional conductors/wires, or multiple sets of bi-directional or uni-directional conductors/wires, and certain detailed interconnections between matrices of the stages have been eliminated for purposes clarity; here, the logic tile interconnects that connect the switch matrices of the stages (and the switches thereof) are configured in a hierarchical network and, as such, are interconnected via hierarchy conductors.
Figure 2B:
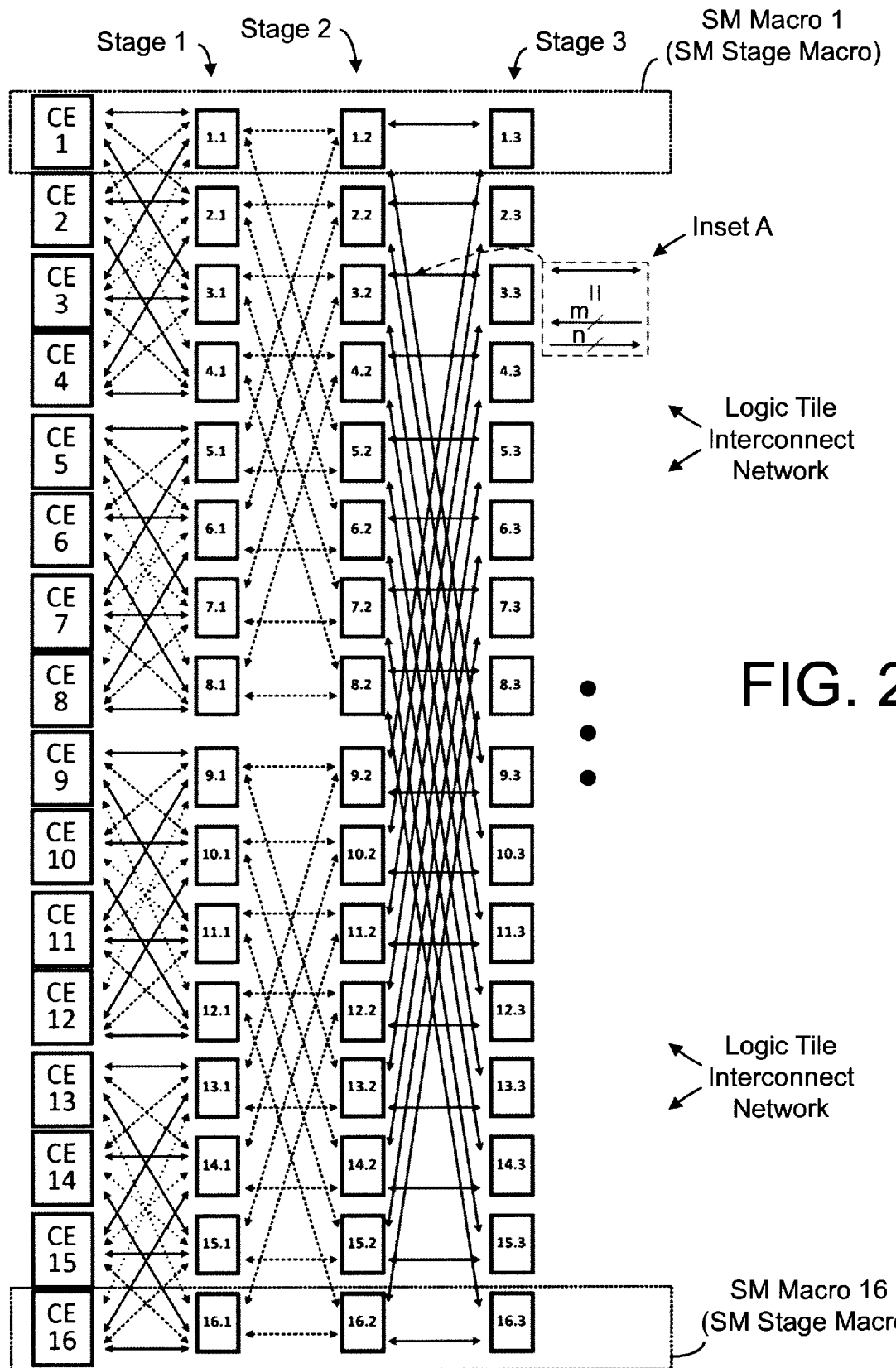
FIG. 2B illustrates an exemplary mixed-radix interconnect architecture embodiment of an exemplary logic tile interconnect network according to at least one aspect of the logic tile interconnect network, wherein each switch matrix of Stage 1 (SM1) is a radix-4 (CE↔SM1) and each switch matrix of Stage 2 (SM2) and Stage 3 (SM3) is a radix 2 (SM1↔SM2 and SM2↔SM3, respectively); notably, each bidirectional wire may be two sets of uni-directional wires (see dotted box labeled Inset A)—one set of m downstream wires (propagating towards the computing element ("CE") input), and one set of n upstream wires (propagating away from the CE output); the m and n for each wire segment may or may not be equal to that of any other wire segment, nor does it need to equal the m and n of the CE inputs and outputs; however, unless otherwise specified, the same m and n may be employed for the entire network; further, an IC designer may create a SM macro (see box labeled "SM Macro 1") and then instantiate the same SM macro ×16 times and connect all the outward-branching connections between the SM macros; a particular/selected route is defined or configured by controlling or programming the switches (e.g., control signals applied to the control inputs of the switches determines which input of the switch is connected to the output of the switch); the data corresponding to the control signals applied to the control inputs of the switches to control or program the input selection (i.e., which input is connected to the output) may be stored in memory, for example, resident in the logic tile or external thereto.
Figure 2C:
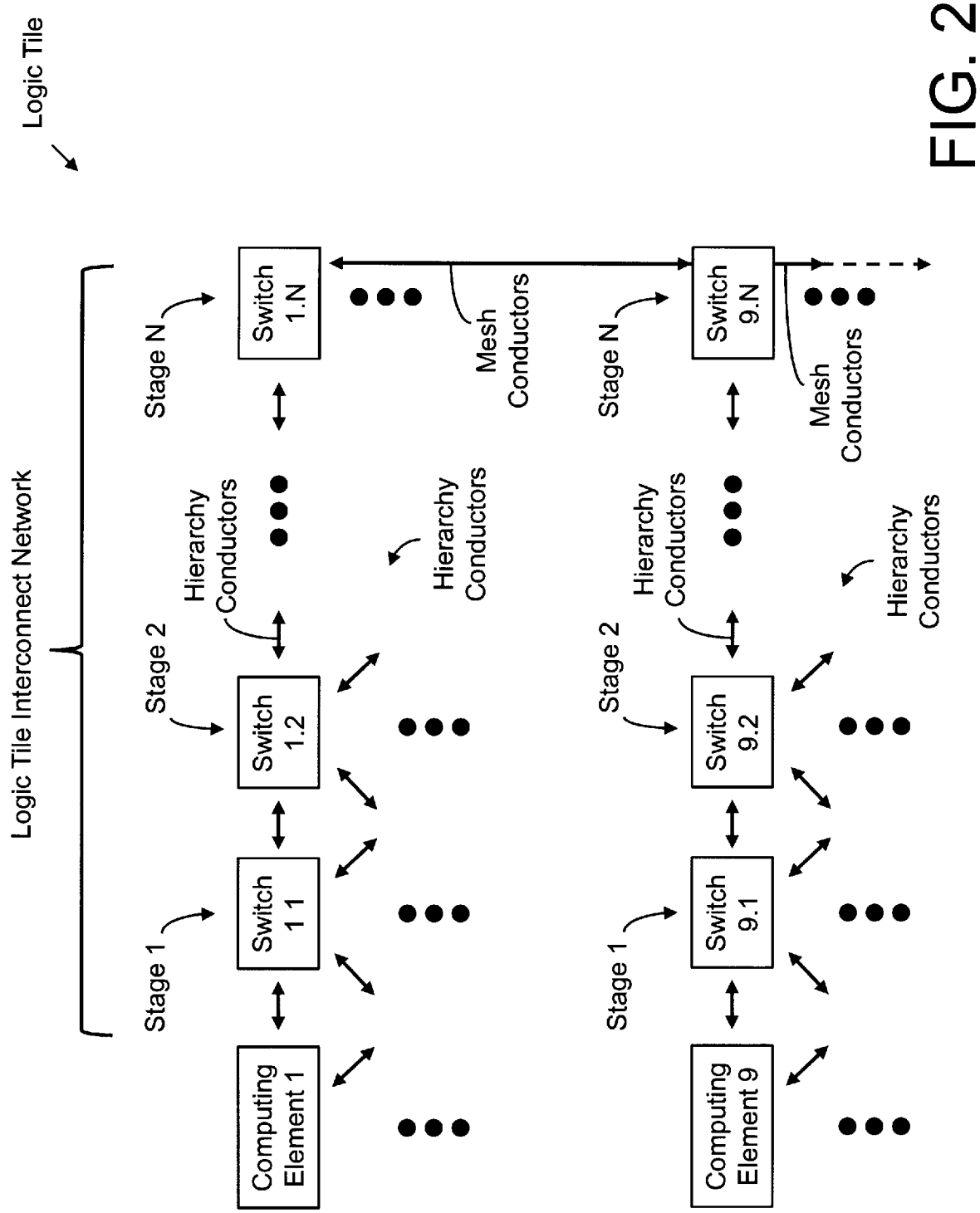
FIGS. 2C, 2D and 2E illustrate simplified exemplary schematic block diagram representations of exemplary mixed-mode logic tile interconnect networks of a programmable logic tiles, according to at least one aspect of the logic tile interconnect network, including a plurality of computing elements (e.g., a data process or digital signal processor), controller circuit, an accelerator, a data encryption engine, a filter, an encoder, a state machine and/or combinational logic circuit); in this illustrative embodiment, switch matrices of certain stages are configured in a hierarchical network of one or more radices and other switch matrices are configured in a mesh network, for example, in FIG. 2C, switch matrices of Stage 1 and Stage 2 are configured in a hierarchical architecture (among others) and switch matrices of Stage N are configured in a mesh architecture wherein, as a mesh architecture (and unlike a hierarchical architecture), the outputs of the switches of Stage N are routed to selected other switches of Stage N—that is, the output routing remains within Stage N (see, FIG. 2C wherein the signal travels between switches 1.N and 9.N, and thereafter the signal may travel within the other Stages connected to the mesh network—e.g., to the CE by entering the hierarchical network via Stage N−1); (see also, FIG. 2D wherein the signal travels between switches 1.2 and 9.2, and thereafter the signal may travel within the other Stages connected to the mesh network—e.g., to the CE by entering the hierarchical network via Stage 1); further, in FIG. 2E, switch matrices of Stage 1 is configured in a hierarchical architecture (and other Stages may as well) and switch matrices of Stages 2 and N are configured in a mesh architecture wherein, as a mesh architecture (and unlike a hierarchical architecture), the outputs of the switches of Stages 2 and N are routed to a plurality of selected other switches of Stages 2 and N, respectively—that is, the output of each switch of Stage 2 and N is routed to a plurality of switches of the Stage 2 and Stage N, respectively, and, as such, that is, the output routing remains within Stage 2 and Stage N, respectively; the switch matrix/matrices of the stage(s) (and the switches thereof) that are configured in a hierarchical network are interconnected via hierarchy conductors and the switch matrix/matrices of the stage(s) (and the switches thereof) that are configured in a mesh network are interconnected via mesh conductors; notably, in one embodiment, certain of the mesh conductors that connect to the mesh stages of the logic tile interconnect network may connect to one or more mesh stages of the logic tile interconnect network of other logic tiles (see, e.g., FIG. 2H); again, each bidirectional wire may be a single conductor or multiple sets of unidirectional wires/conductors and much of the detailed interconnections between switch matrices of the stages have been eliminated for purposes clarity.
Figure 2D:
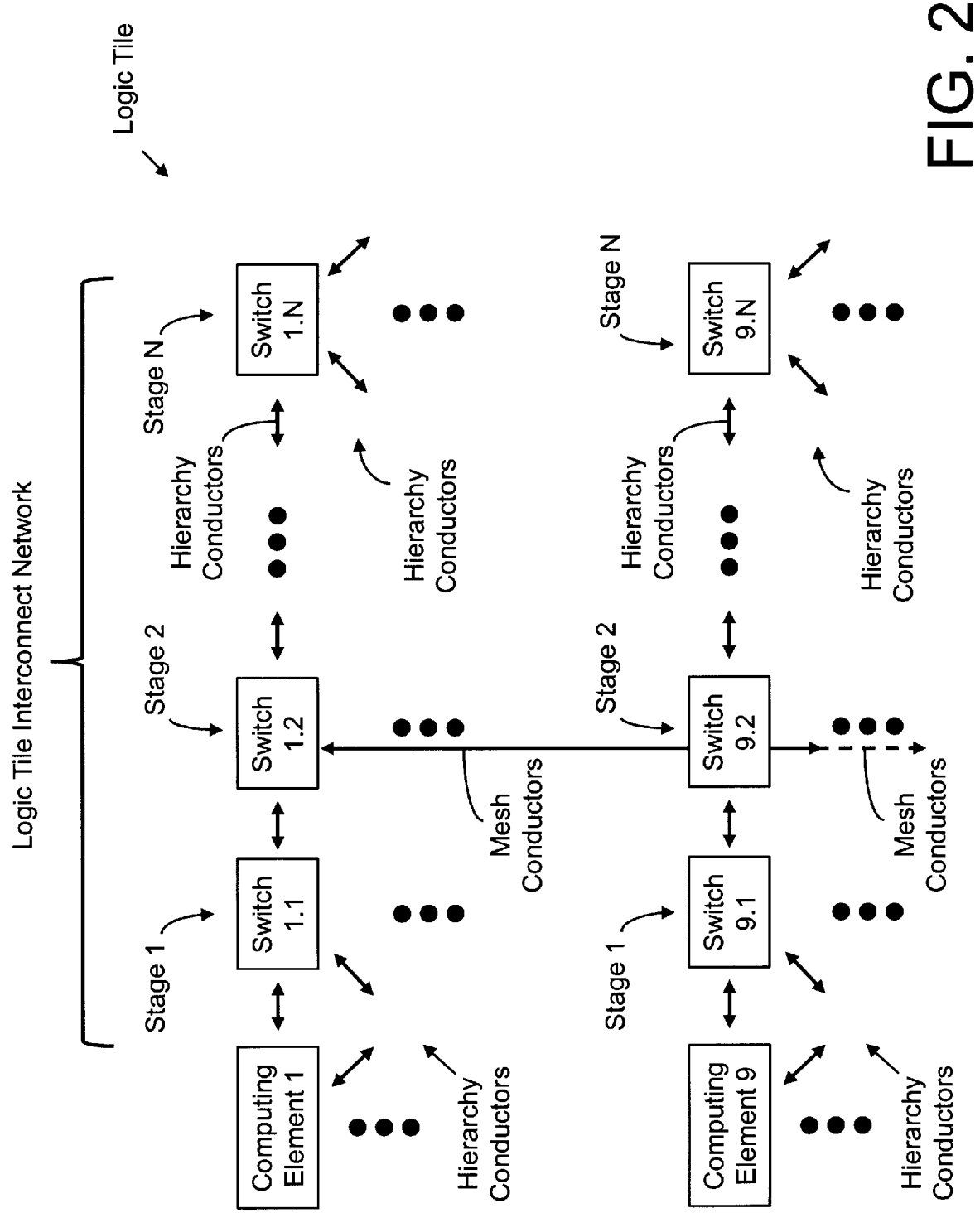
Figure 2E:
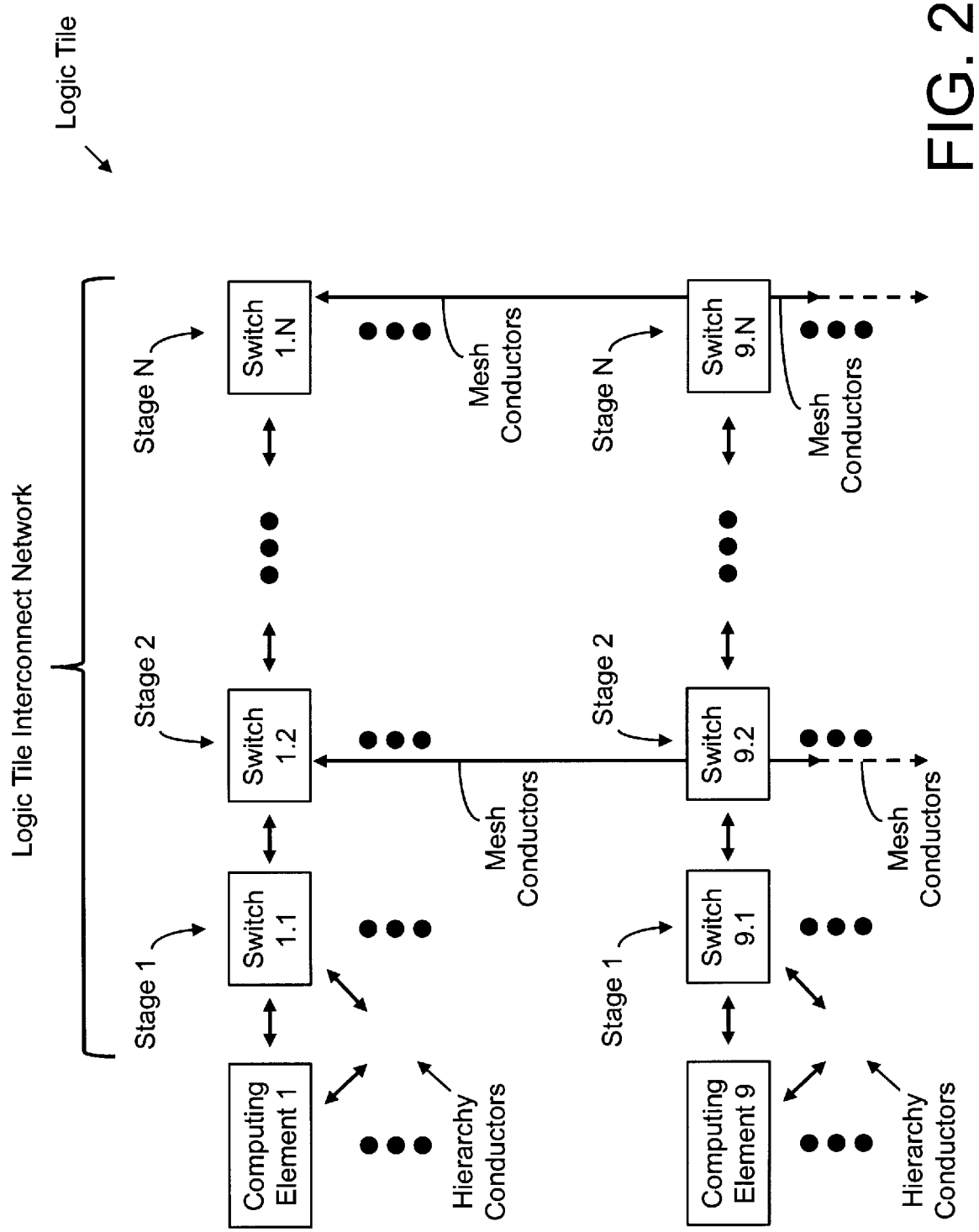
Figure 2F:
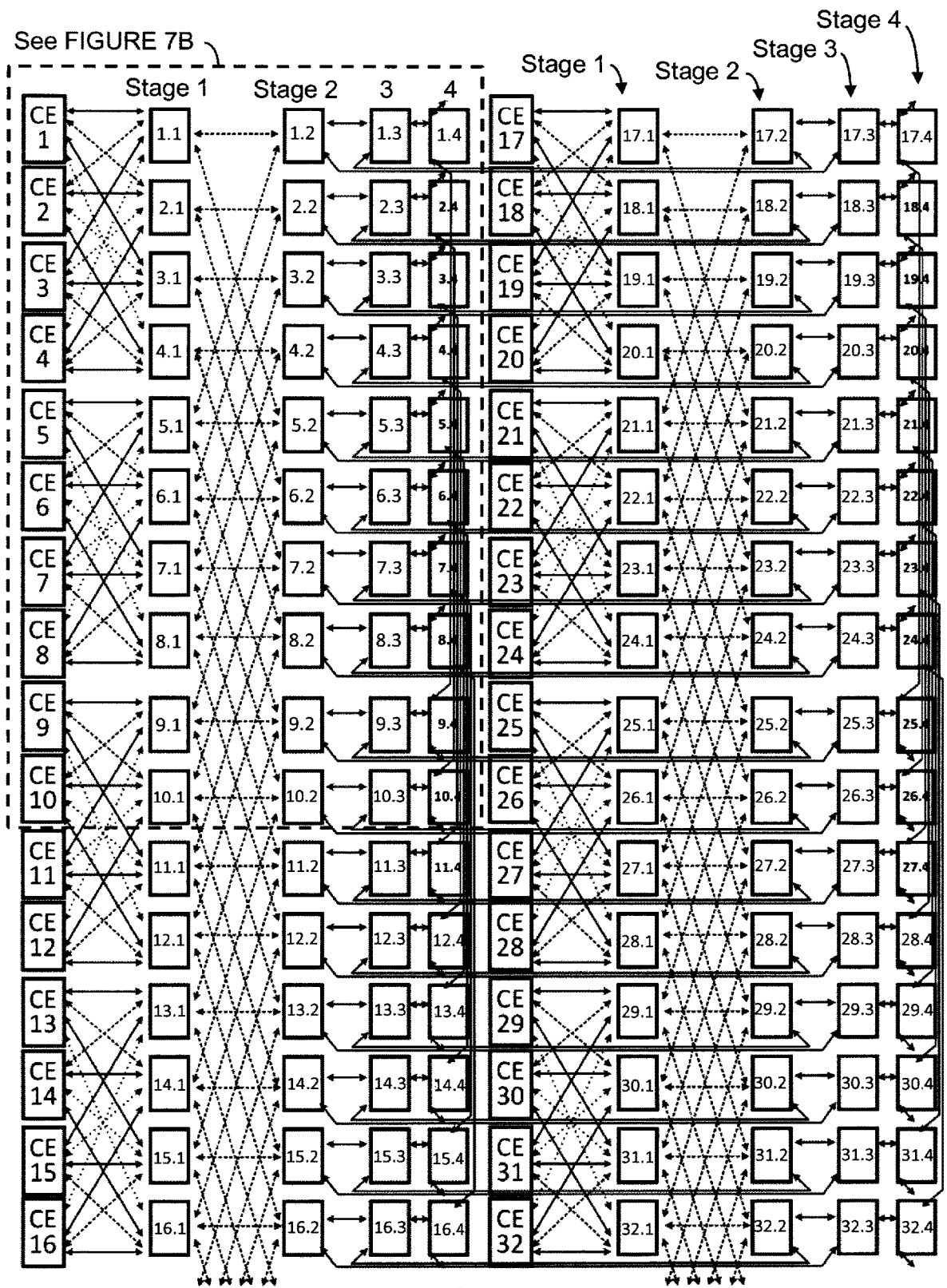
FIG. 2F illustrates an exemplary mixed-radix, mixed-mode interconnect architecture according to at least one aspect of the logic tile interconnect network, wherein each switch matrix of Stage 1 (SM1) is a radix-4 (CE↔SM1), each switch matrix of Stage 2 (SM2) is a boundary-less radix-3 (SM1↔SM2), each switch matrix of Stage 3 (SM3) is a radix-2 (SM2↔SM3) and each switch matrix of Stage 4 (SM4) is connected in a mesh interconnect architecture.
Figure 2G:
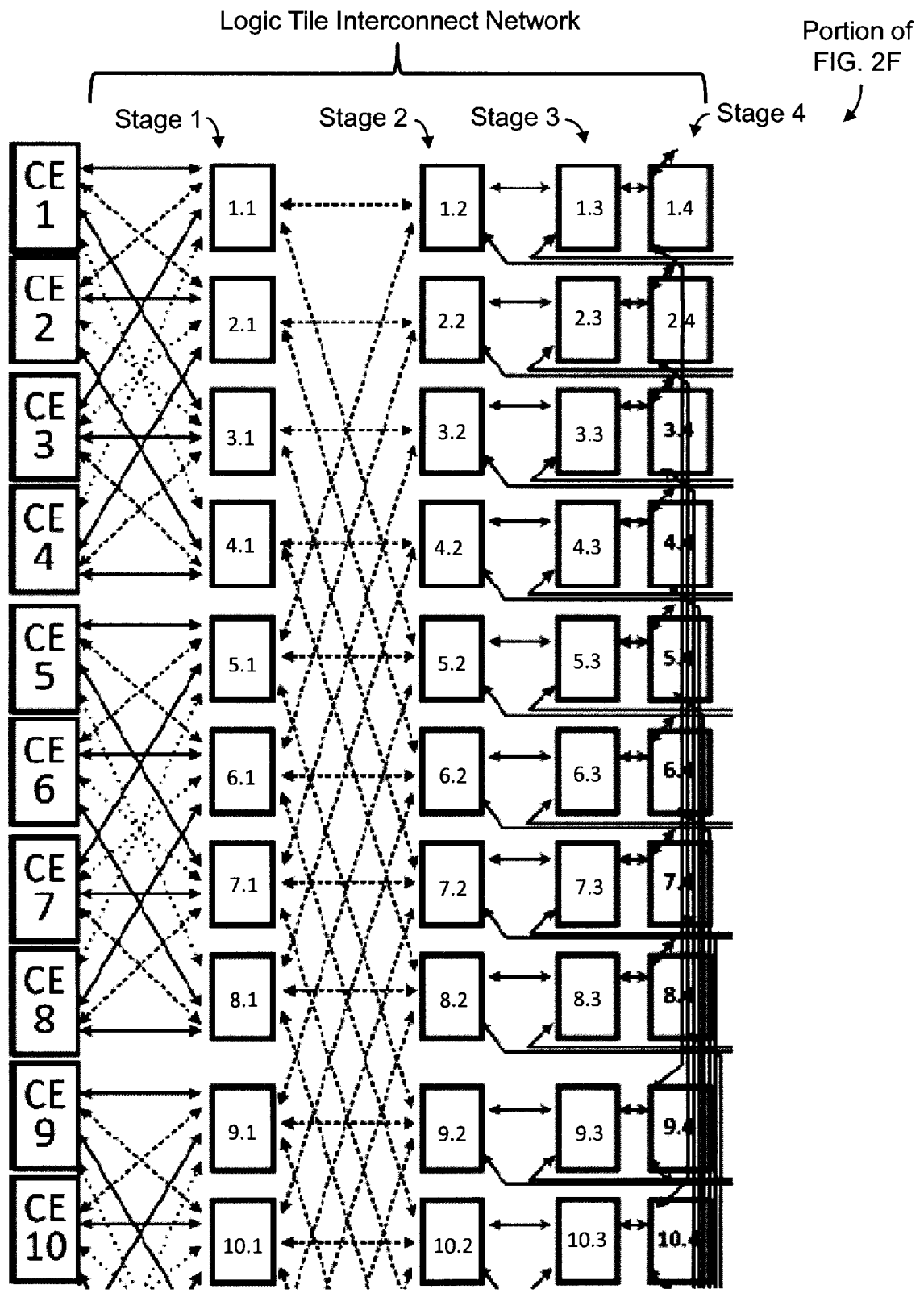
FIG. 2G illustrates a selected portion of FIG. 2F as indicated in the illustration of FIG. 2F.
Figure 2H:
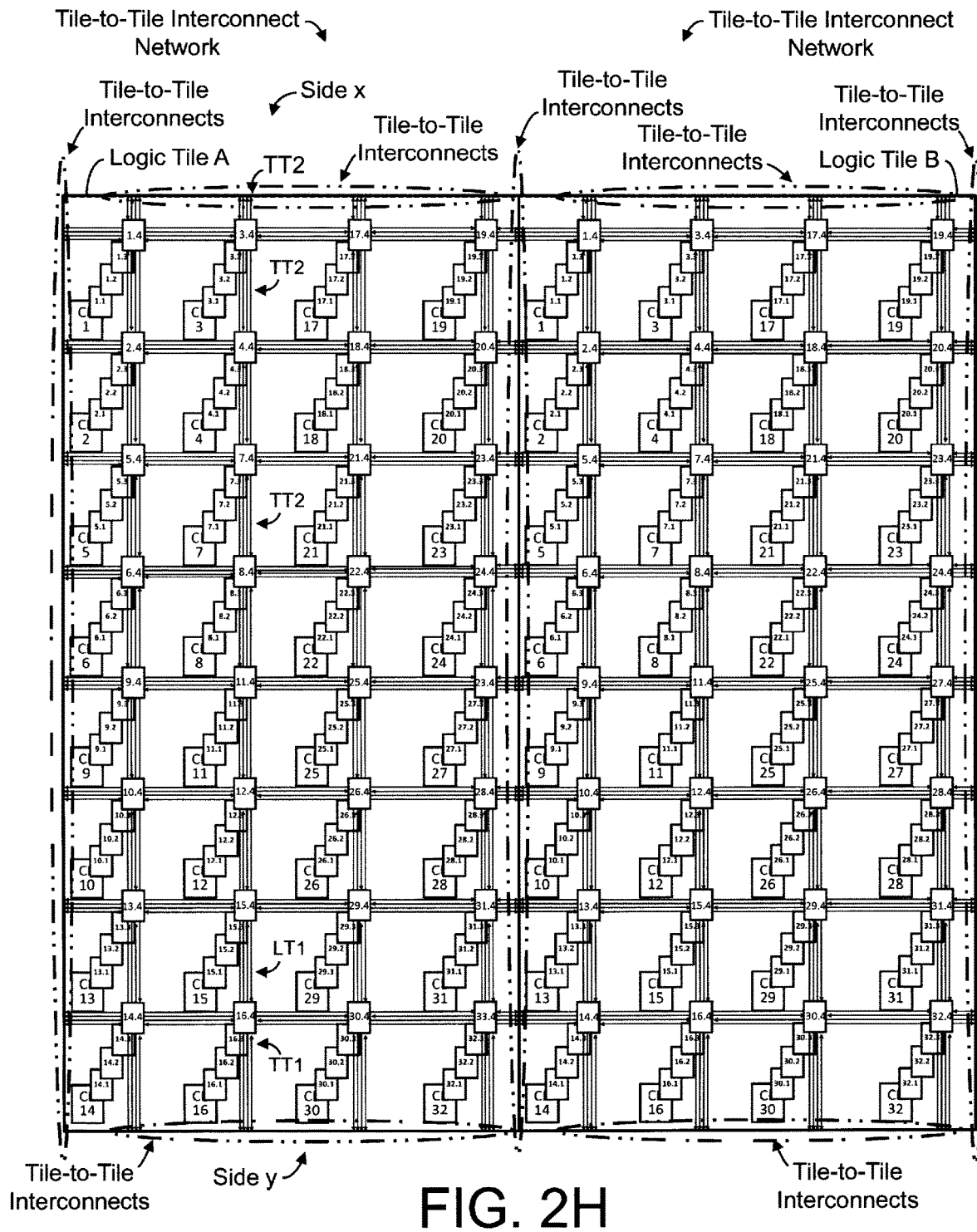
FIG. 2H illustrates, in block diagram form, an exemplary mesh connections of Stage 4 of the exemplary embodiment of, for example, FIG. 2F (notably, the lower three stages may be implemented as a hierarchical network as illustrated in the embodiment of FIG. 2F); here, a signal output by the switches of Stage 4 do not change hierarchy as they propagate through the mesh interconnect network of the logic tile interconnect network and the tile-to-tile interconnect network; that is, the logic tile interconnect network includes hierarchical and mesh interconnects and the tile-to-tile interconnect network includes mesh-type tile-to-tile interconnects which connect switches in the logic tile interconnect network to switches in the logic tile interconnect network of adjacent logic tile(s); in this exemplary embodiment, switches of Stage 4 of the logic tile interconnect network of Logic Tile A connect to switches of Stage 4 of the logic tile interconnect network of Logic Tile A (i.e., via mesh-type logic tile interconnects) as well as to switches of Stage 4 of the logic tile interconnect network of Logic Tile B (i.e., the adjacent logic tile via mesh-type tile-to-tile interconnects)—and vice versa; notably, a signal may travel from switch 1.4 to switch 9.4 of a first logic tile (e.g., Logic Tile A), then to switch 9.4 and switch 17.4 of a second logic tile (e.g., Logic Tile B, a logic tile adjacent to Logic Tile A), and then back to switch 1.4 of the first logic tile (i.e., Logic Tile A) if the router configures the network of the integrated circuit in that manner; notably, a mesh-type tile-to-tile interconnect network or architecture of the plurality of logic tiles is tile-able and the 32-element design of FIG. 2F may be considered as a tile-able macro, which may be replicated to make larger arrays; although in the illustrative embodiment of FIGS. 2F-2H hierarchical networks/interconnects are implemented in the other switch matrix (SM) stages (i.e., Stages 1, 2 and 3) of the logic tile interconnect network, another mesh interconnect network may be implemented as a substitute and replacement of one or more of the hierarchical stages (e.g., Stage 2 may be a mesh stage (see FIG. 2D) or Stages 2 and 4 may be replaced by a mesh stage (see FIG. 2E) that "hops" horizontally and vertically, in addition to (or in lieu of) the Stage 4 mesh of FIG. 2H that "hops" by 4 in each direction); notably, the number of stages described and illustrated herein is exemplary (there may be more or less) wherein the exemplary interconnect network having four (4) stages is provided for illustrative purposes.
Figure 4A:
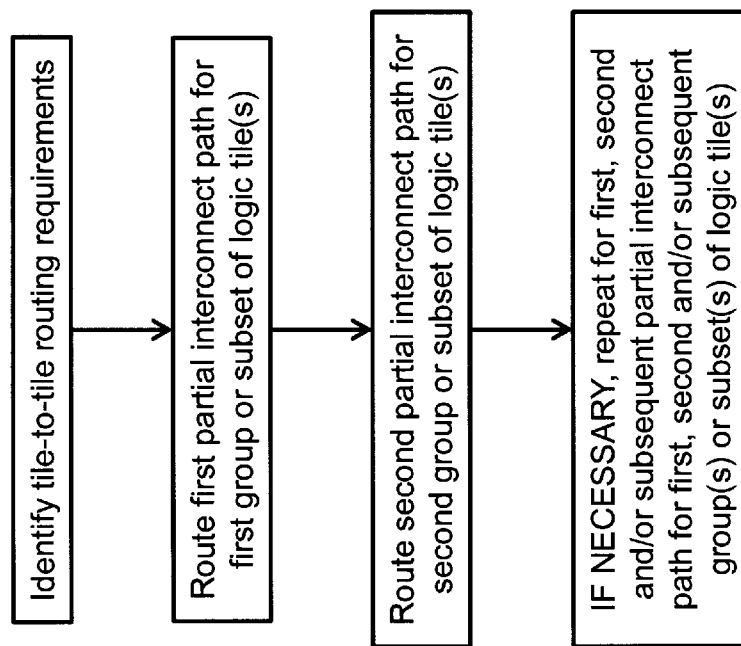
Figure 4B:
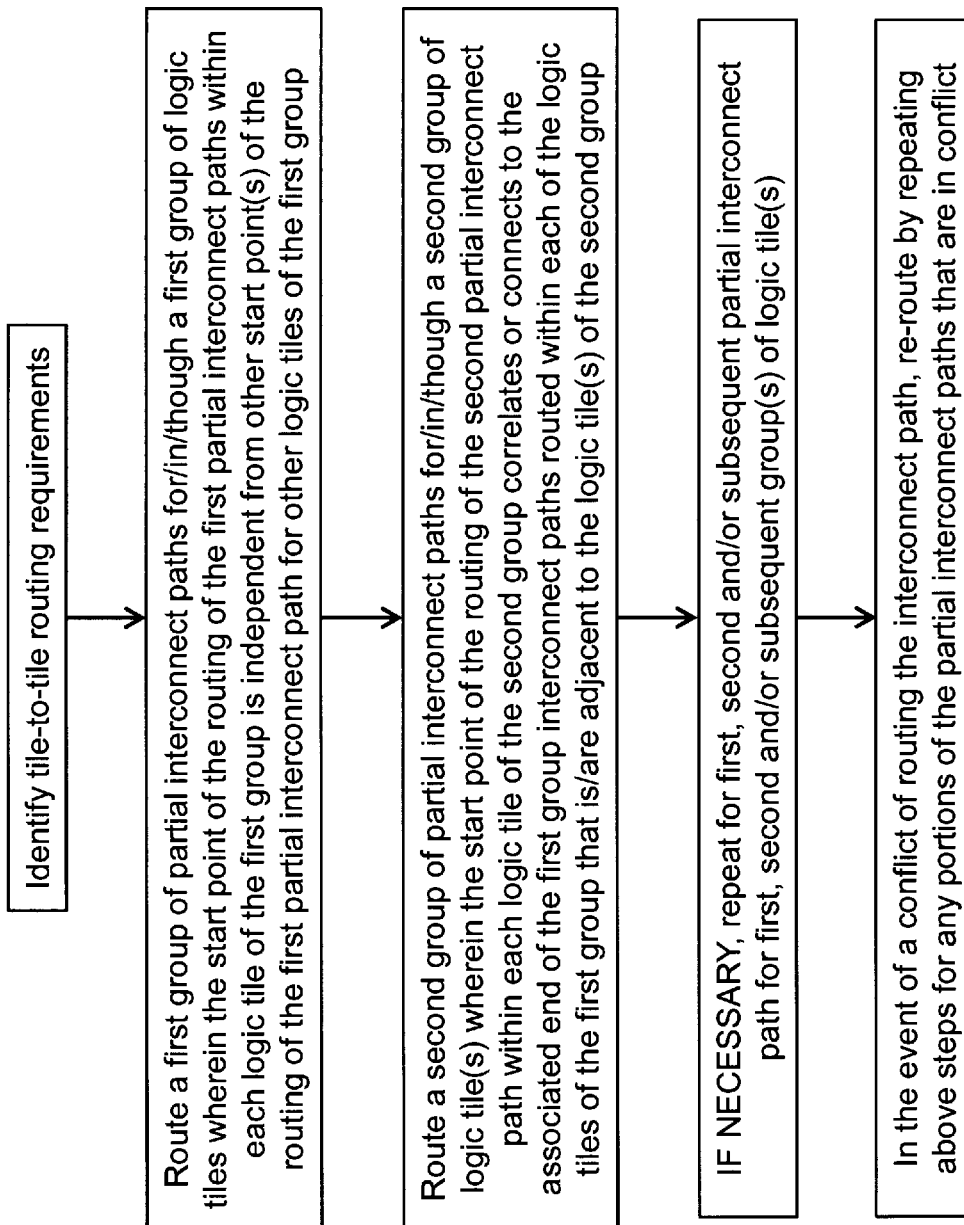
Figure 4C:
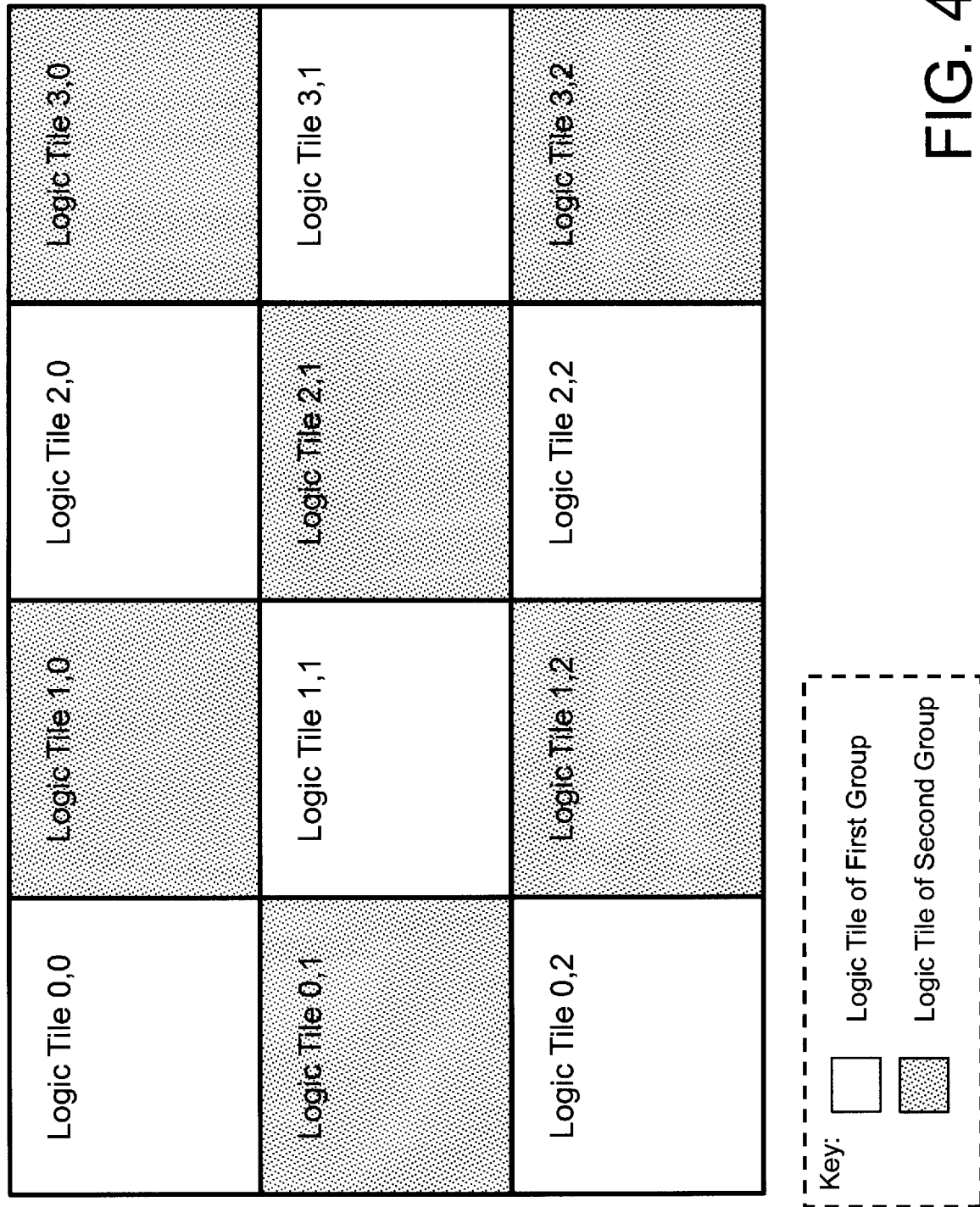
Figure 5A:
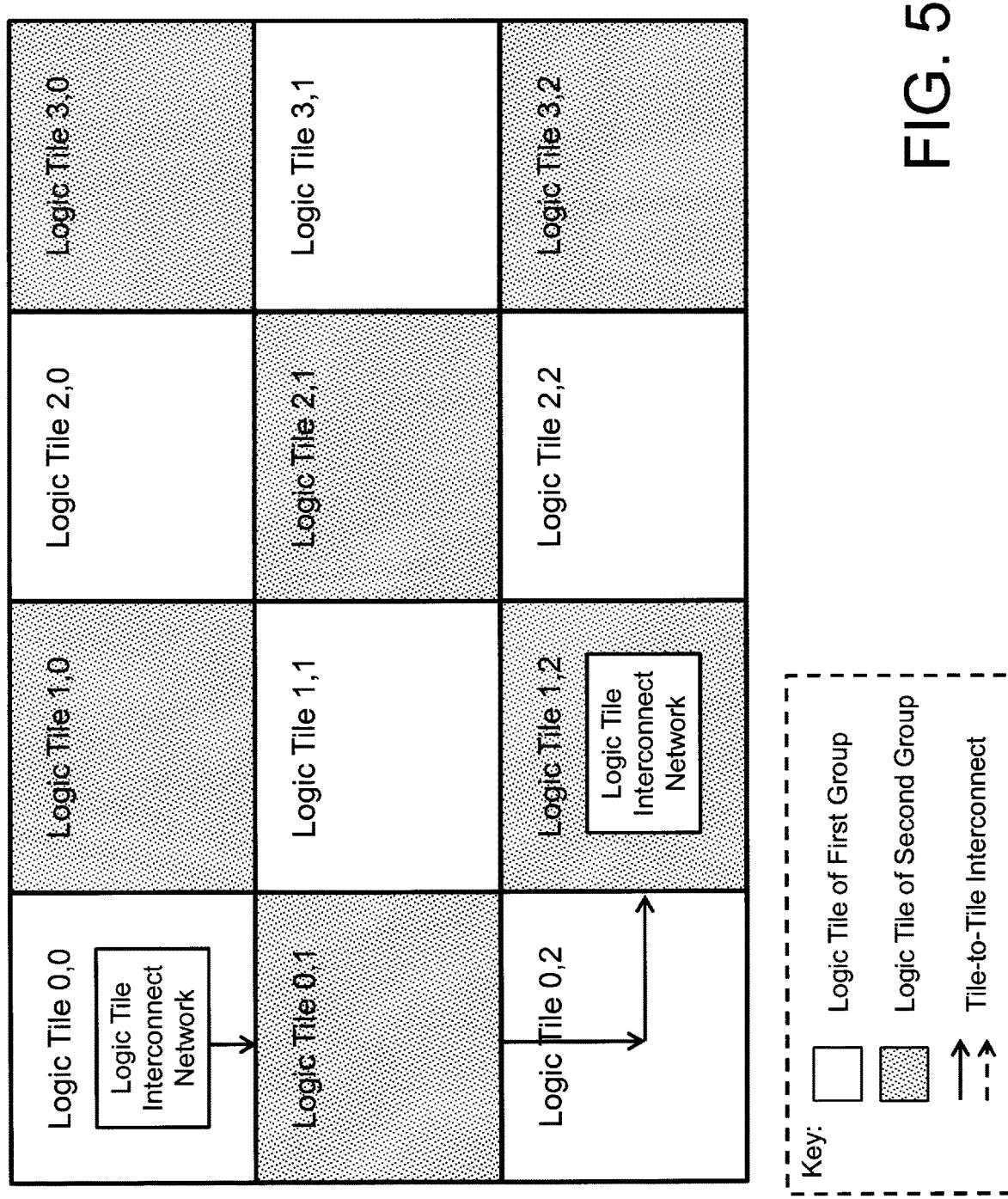
Figure 5B:
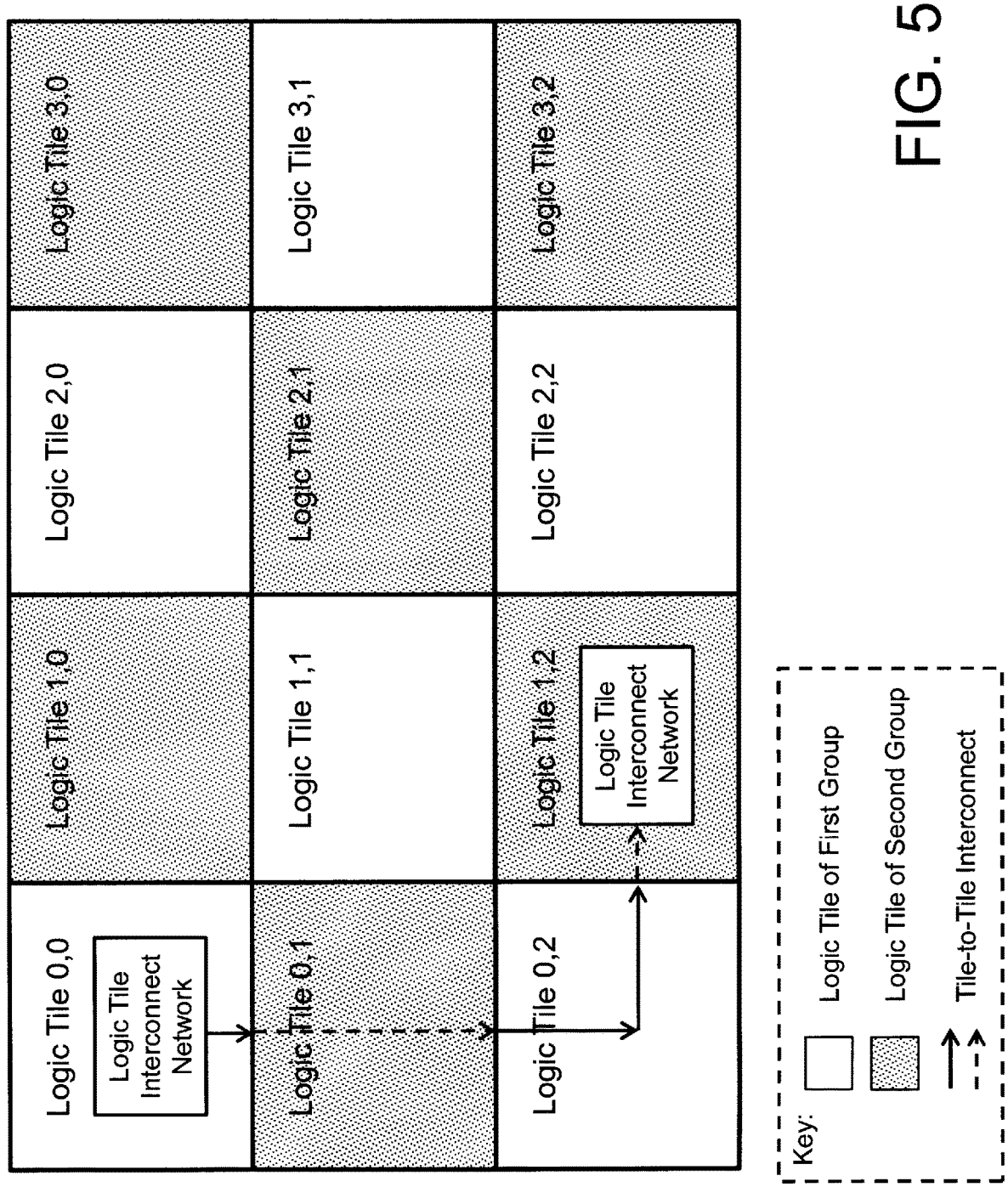
Figure 6A:
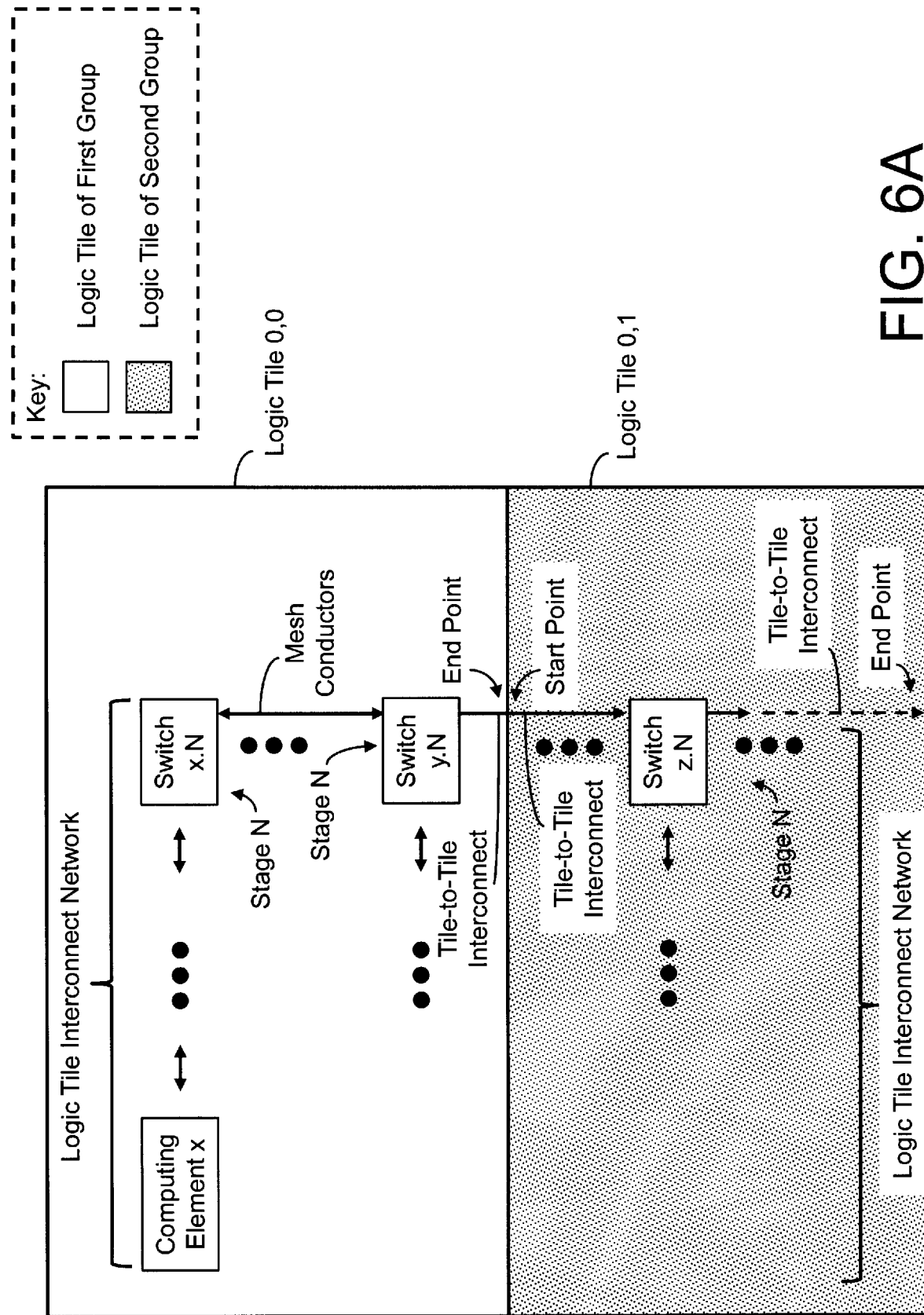
Figure 6B:
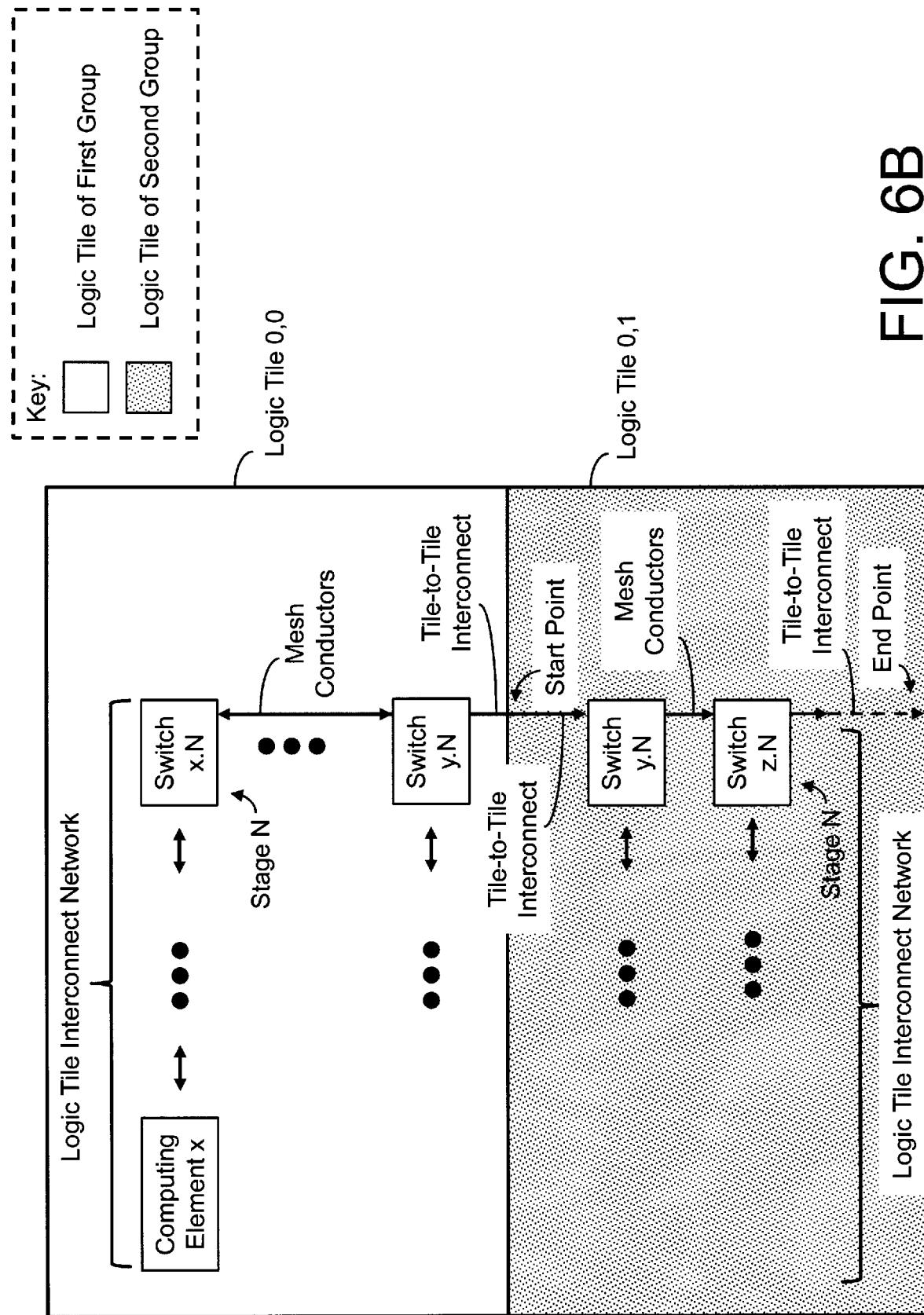
Figure 6C:
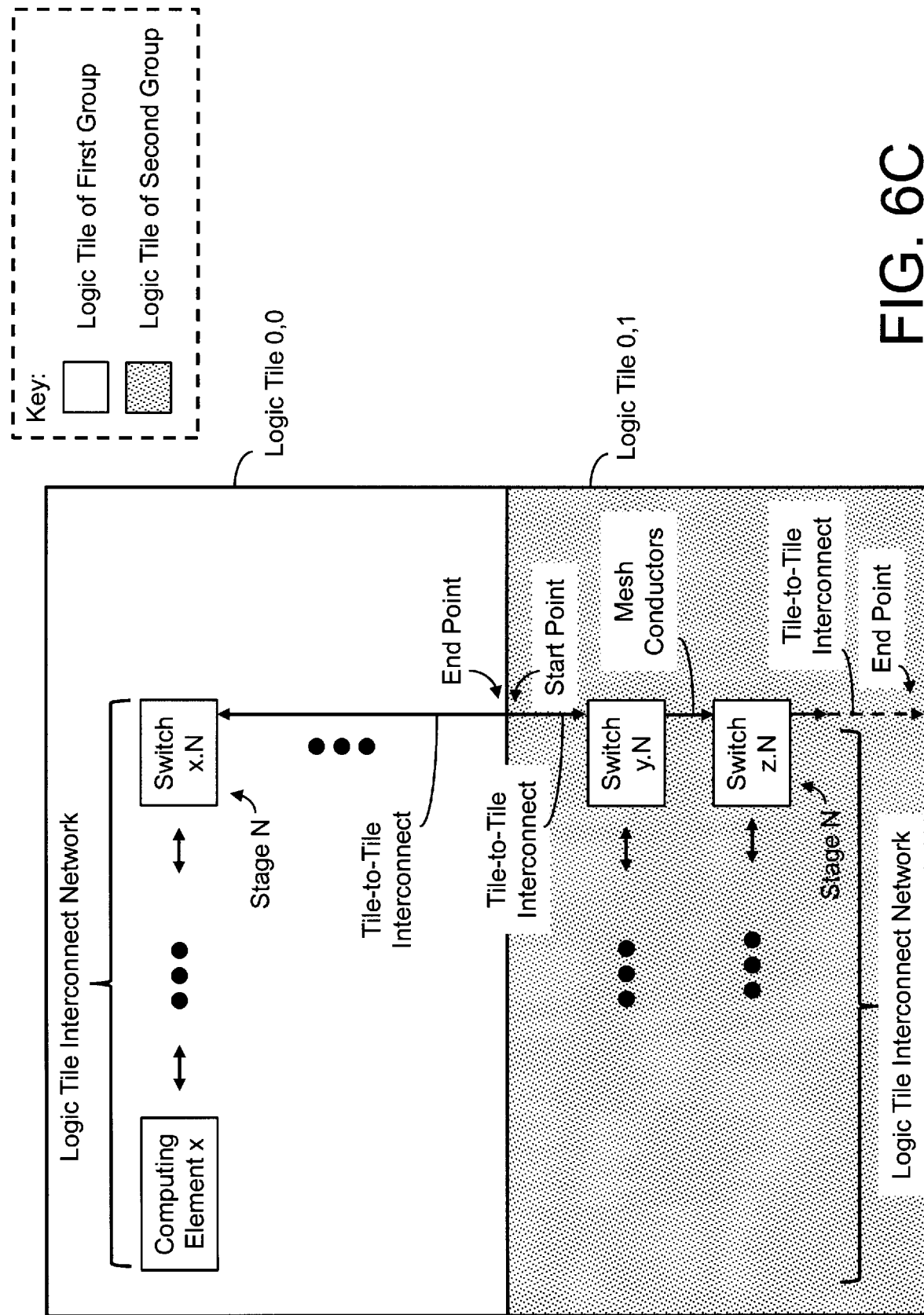
Figure 6D:
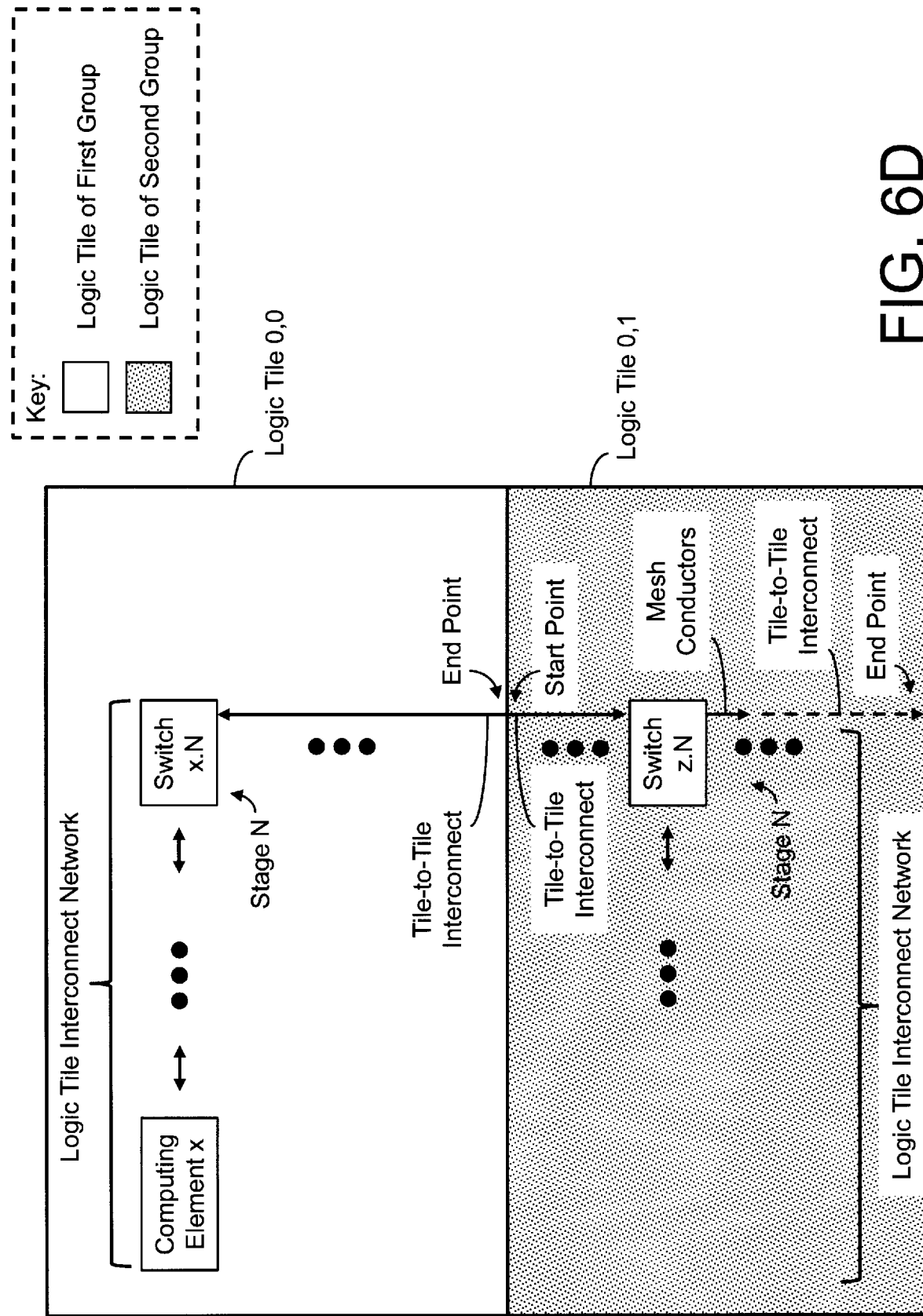
Figure 7A:
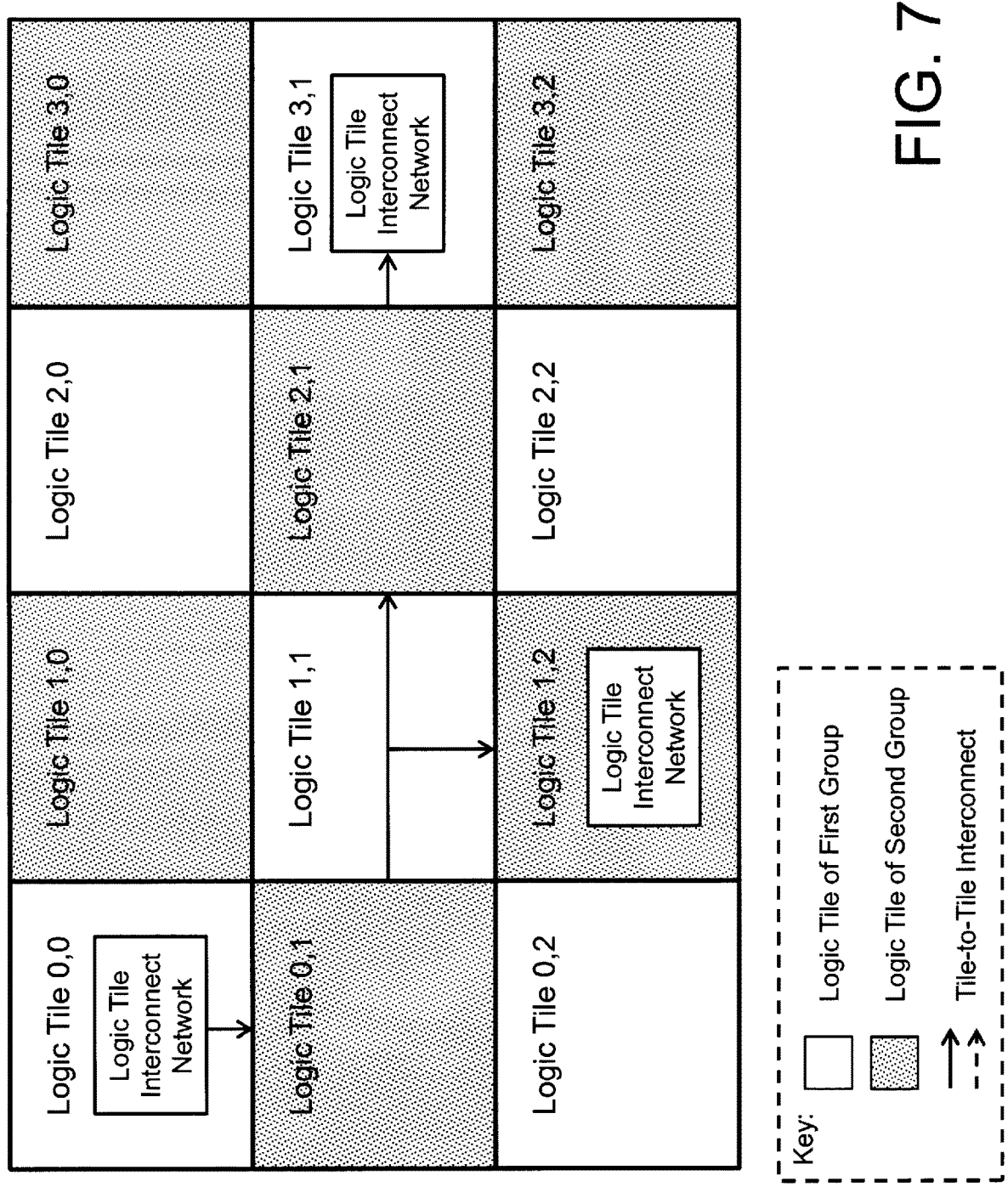
Figure 7B:
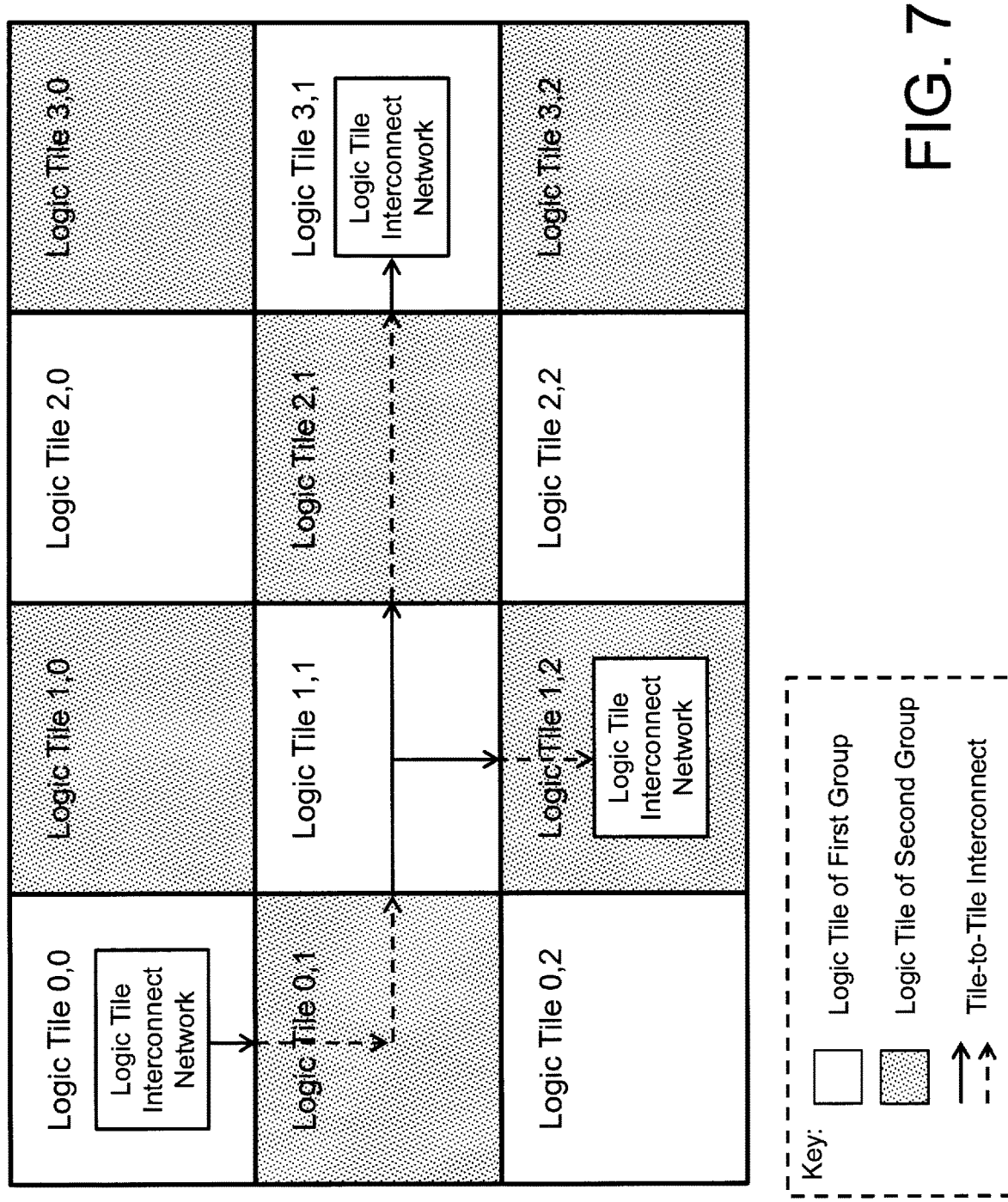
Figure 7C:
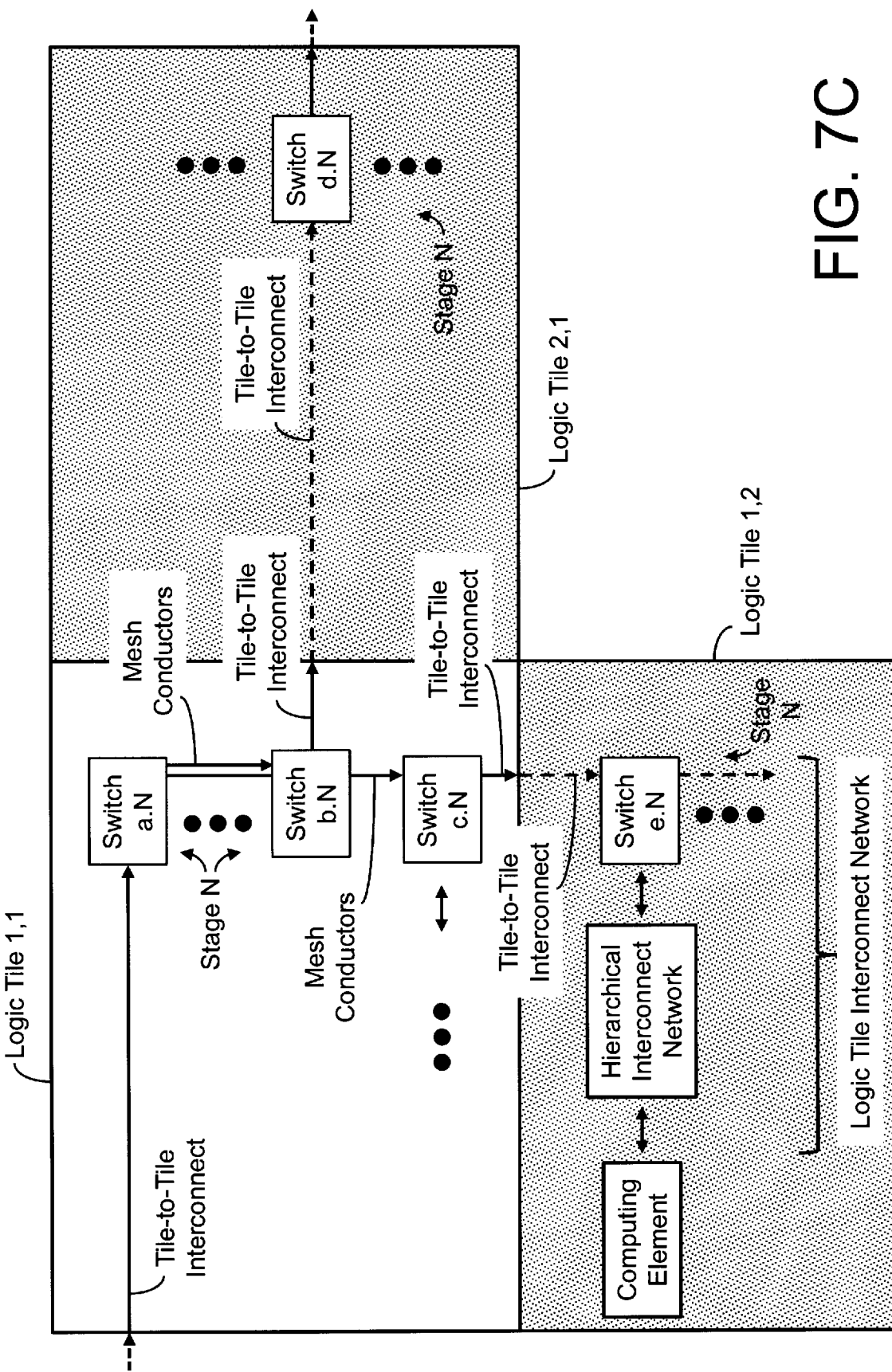
Figure 8A:
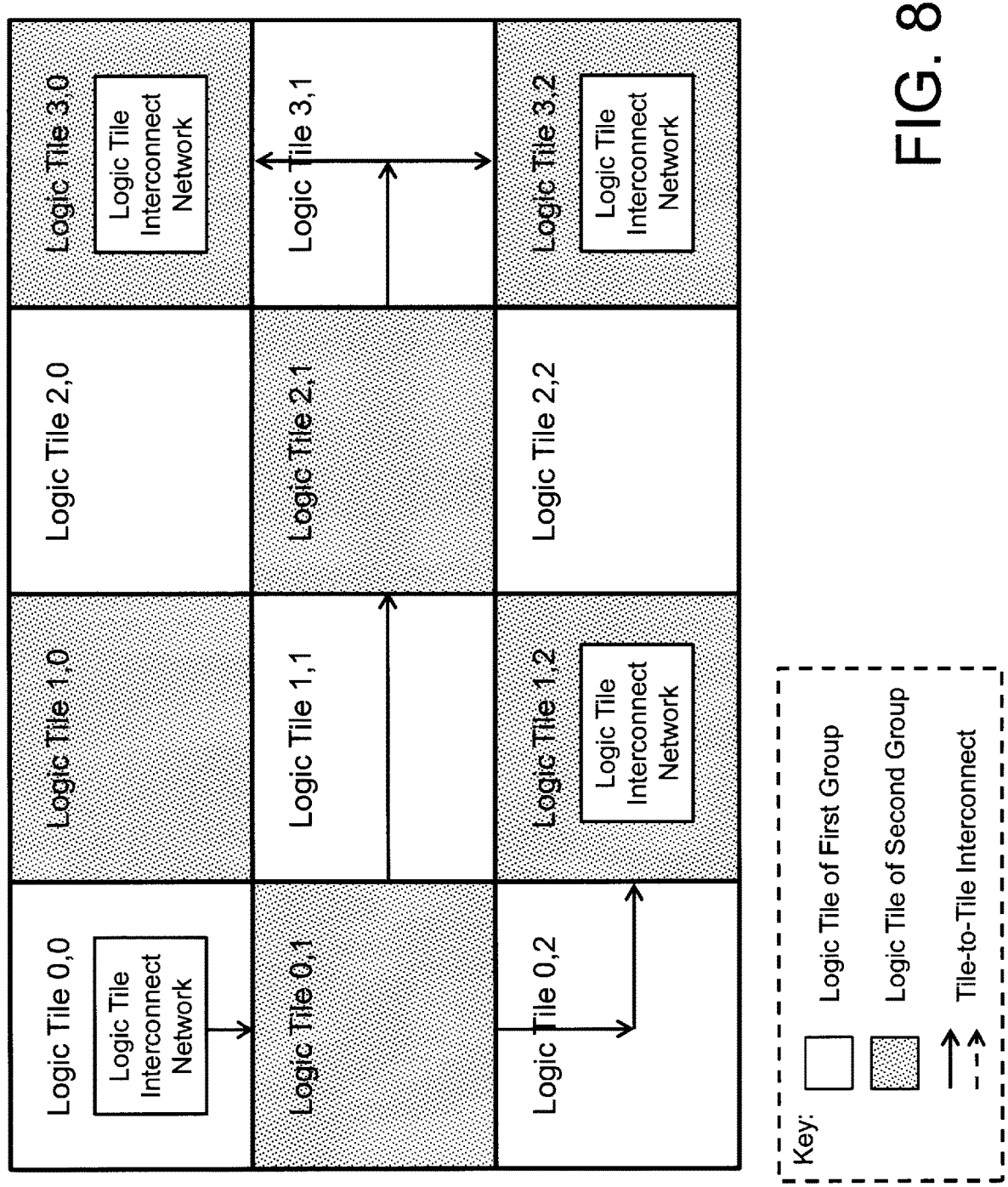
Figure 8B:
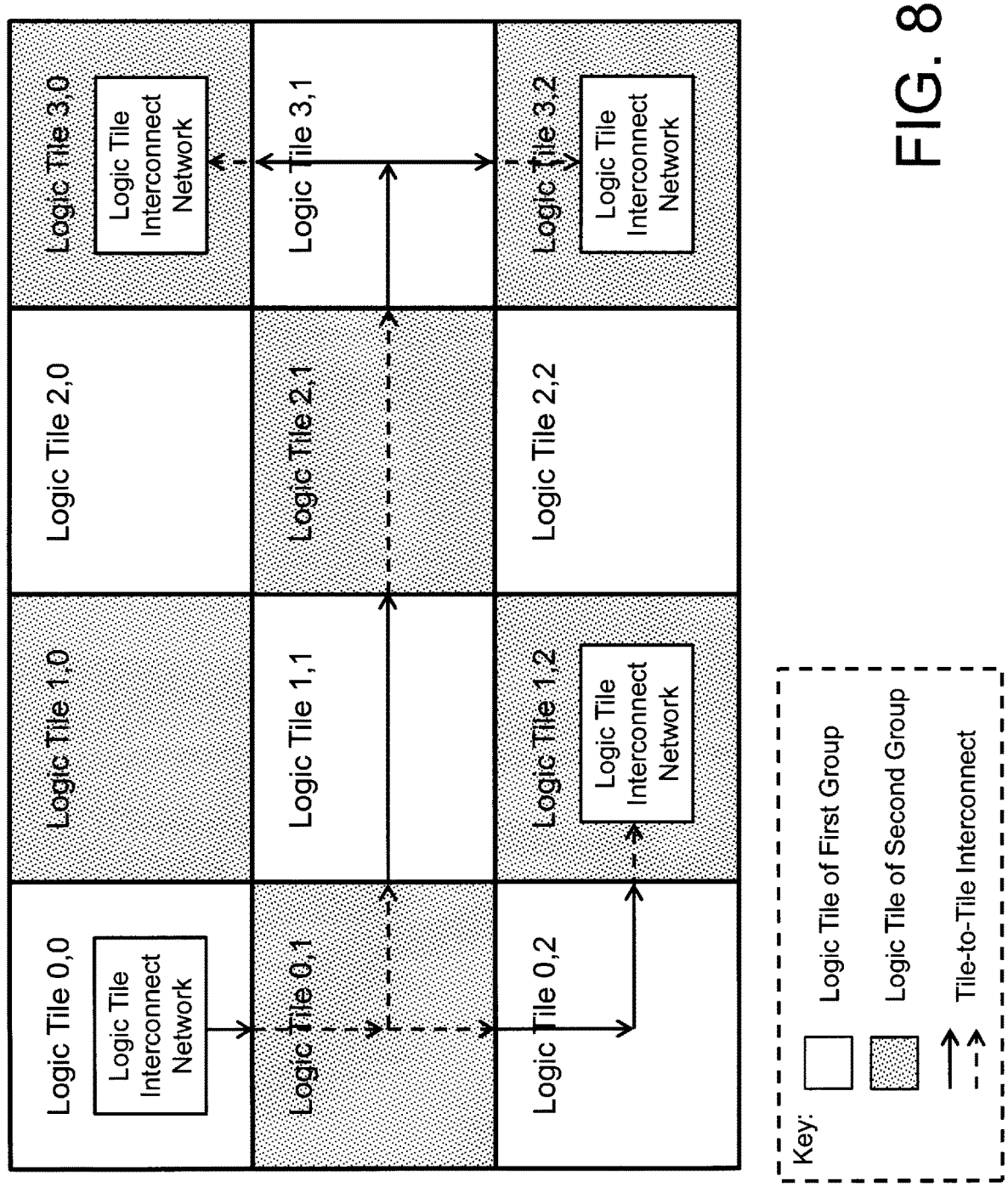
Figure 9A:
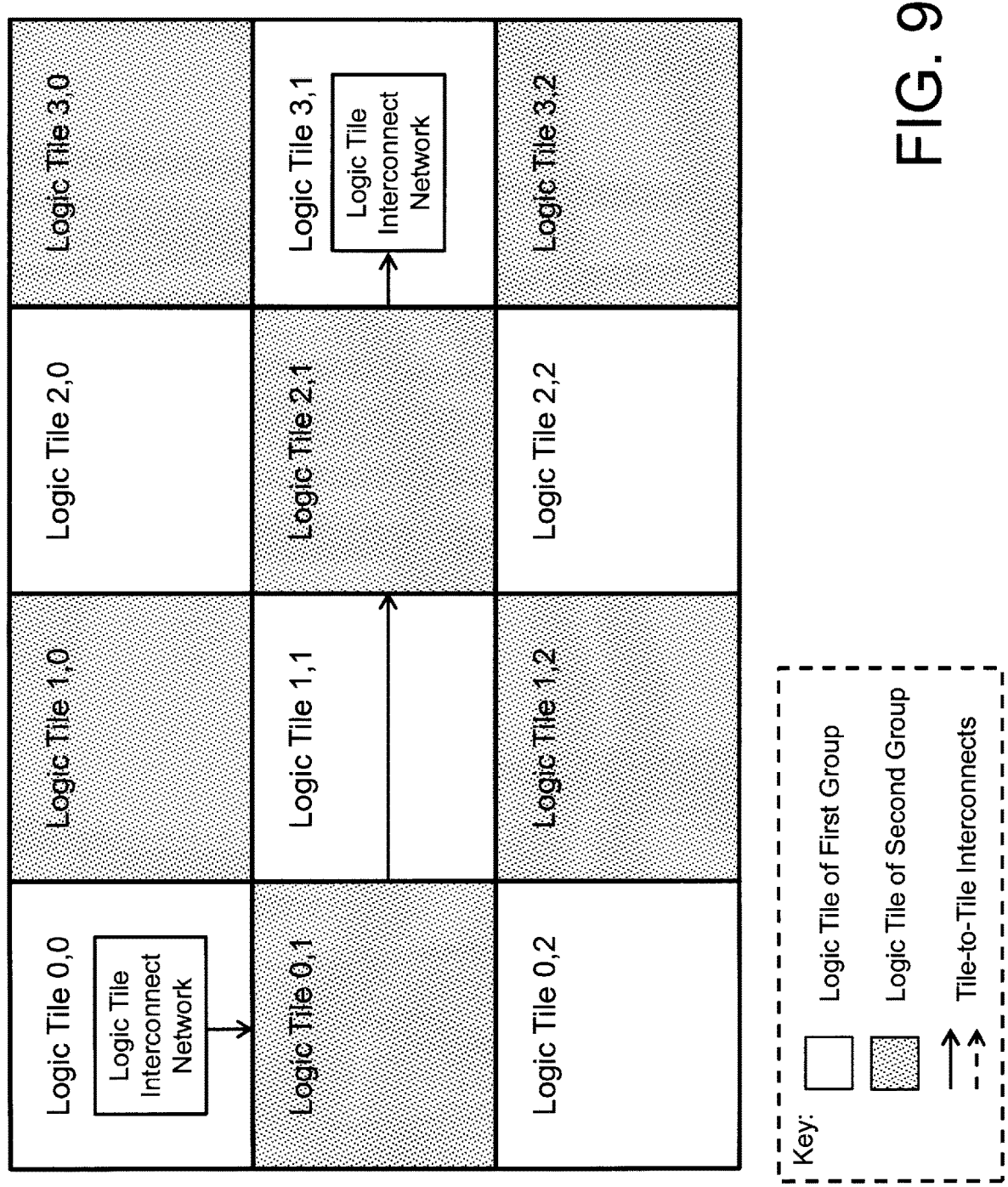
Figure 9B:
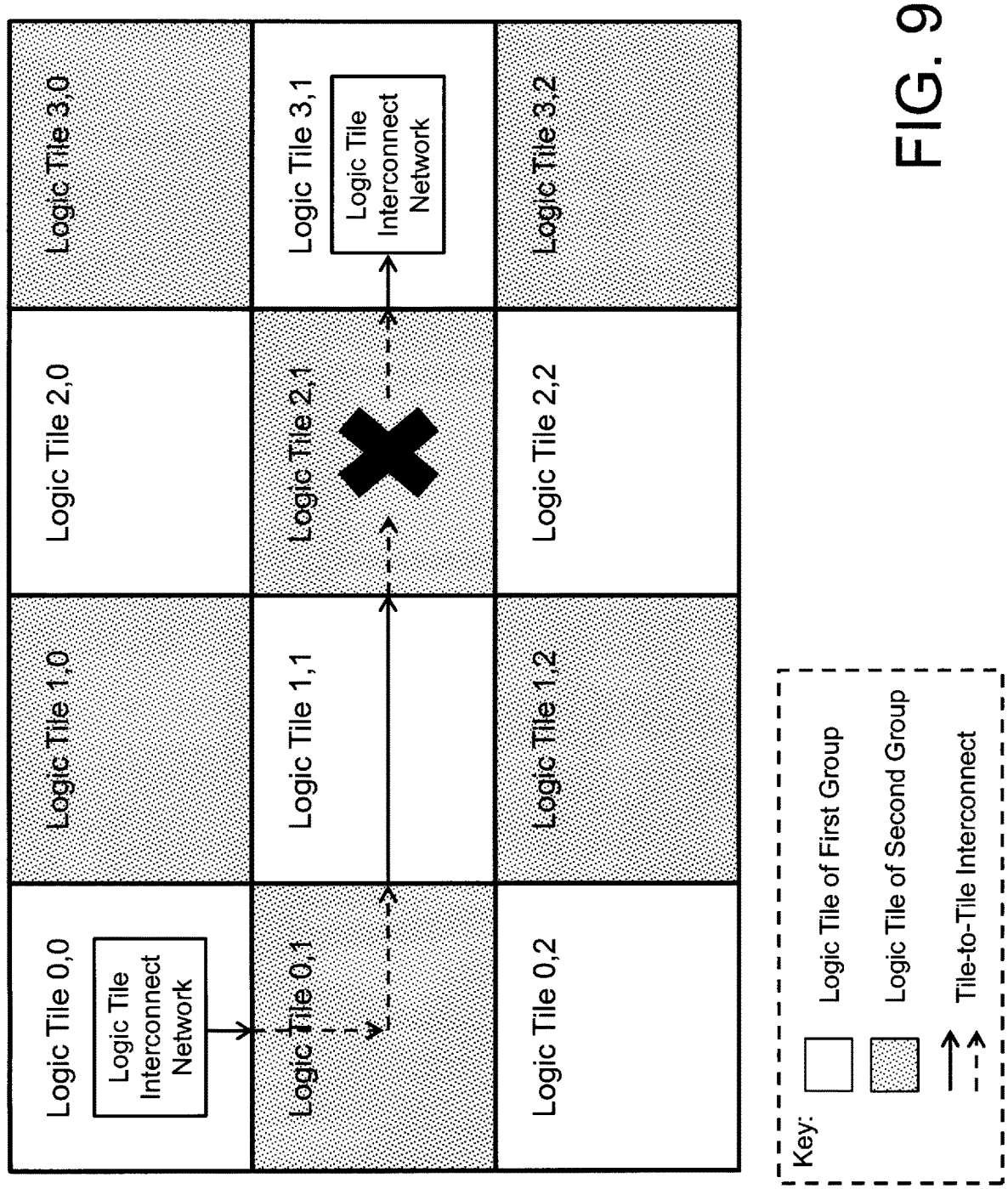
Figure 9C:
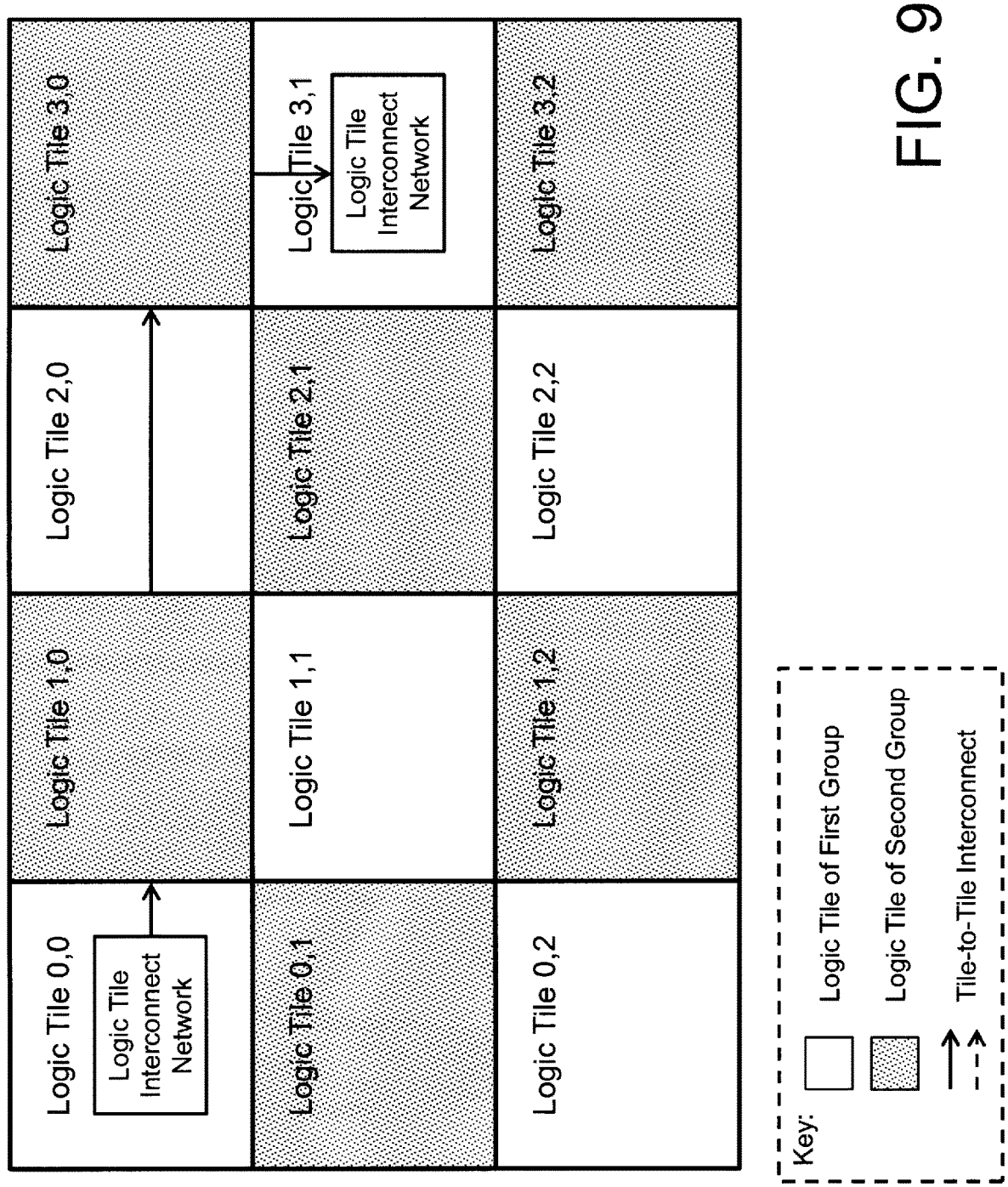
Figure 9D:
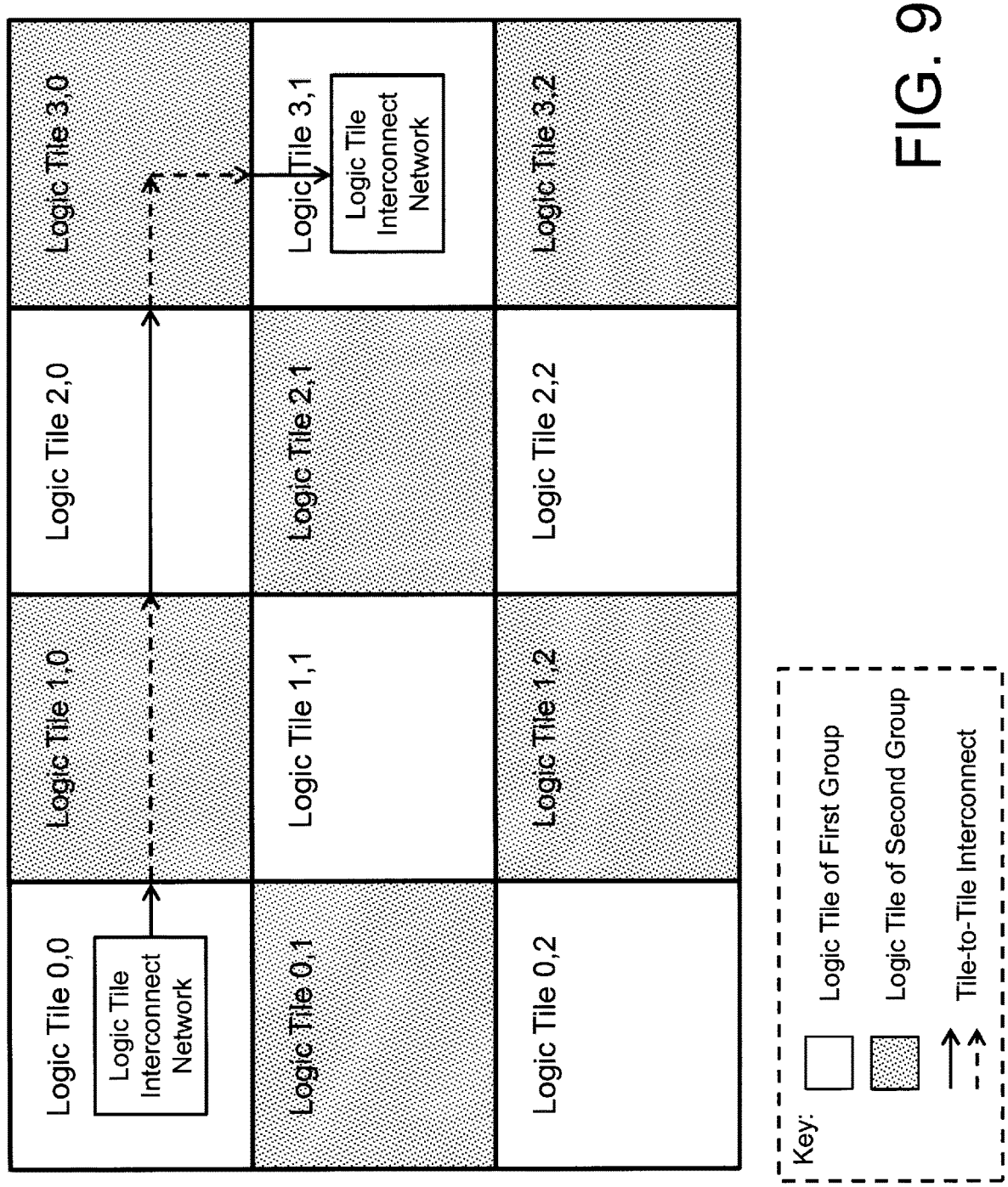
Figure 10A:
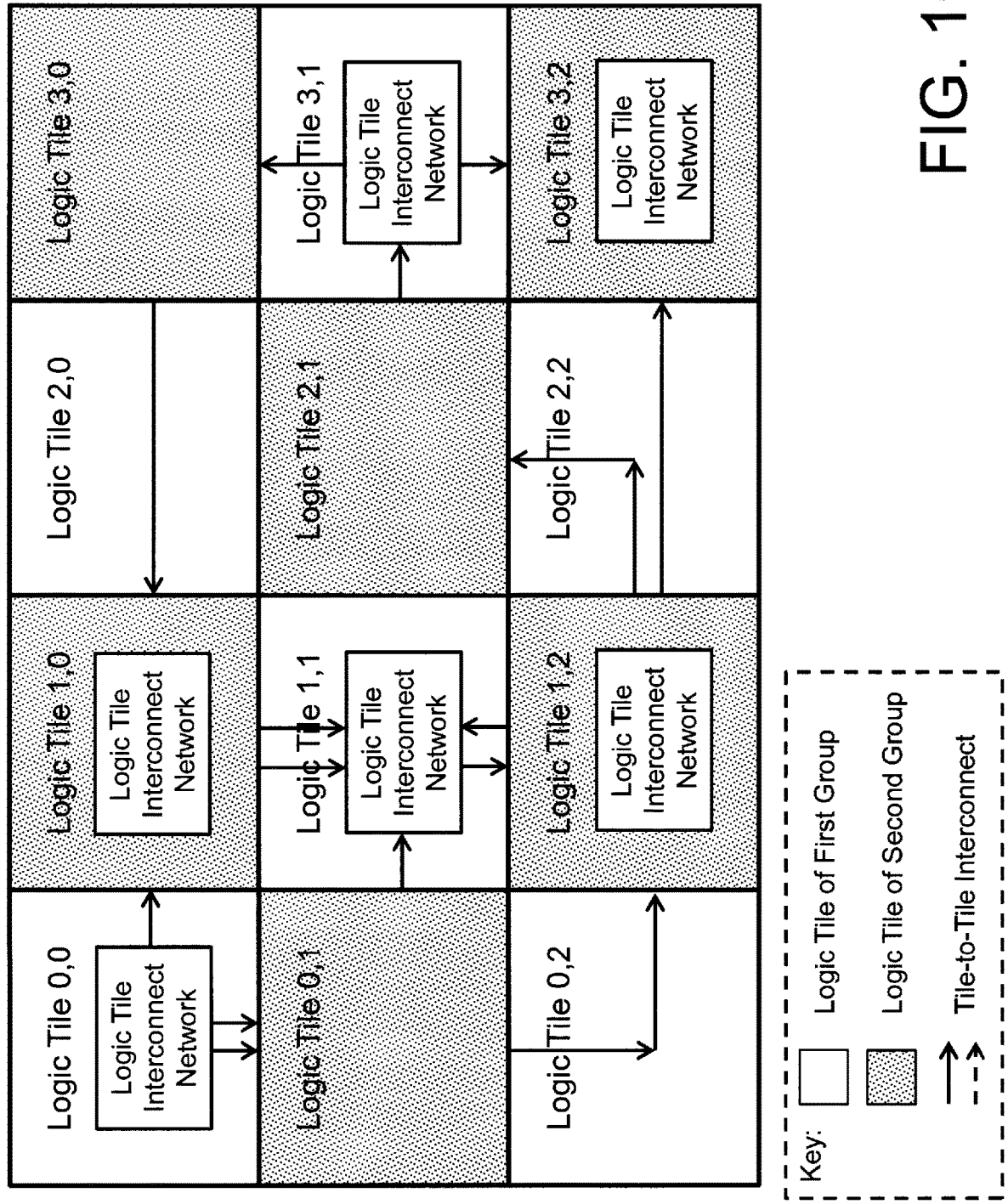
Figure 10B:
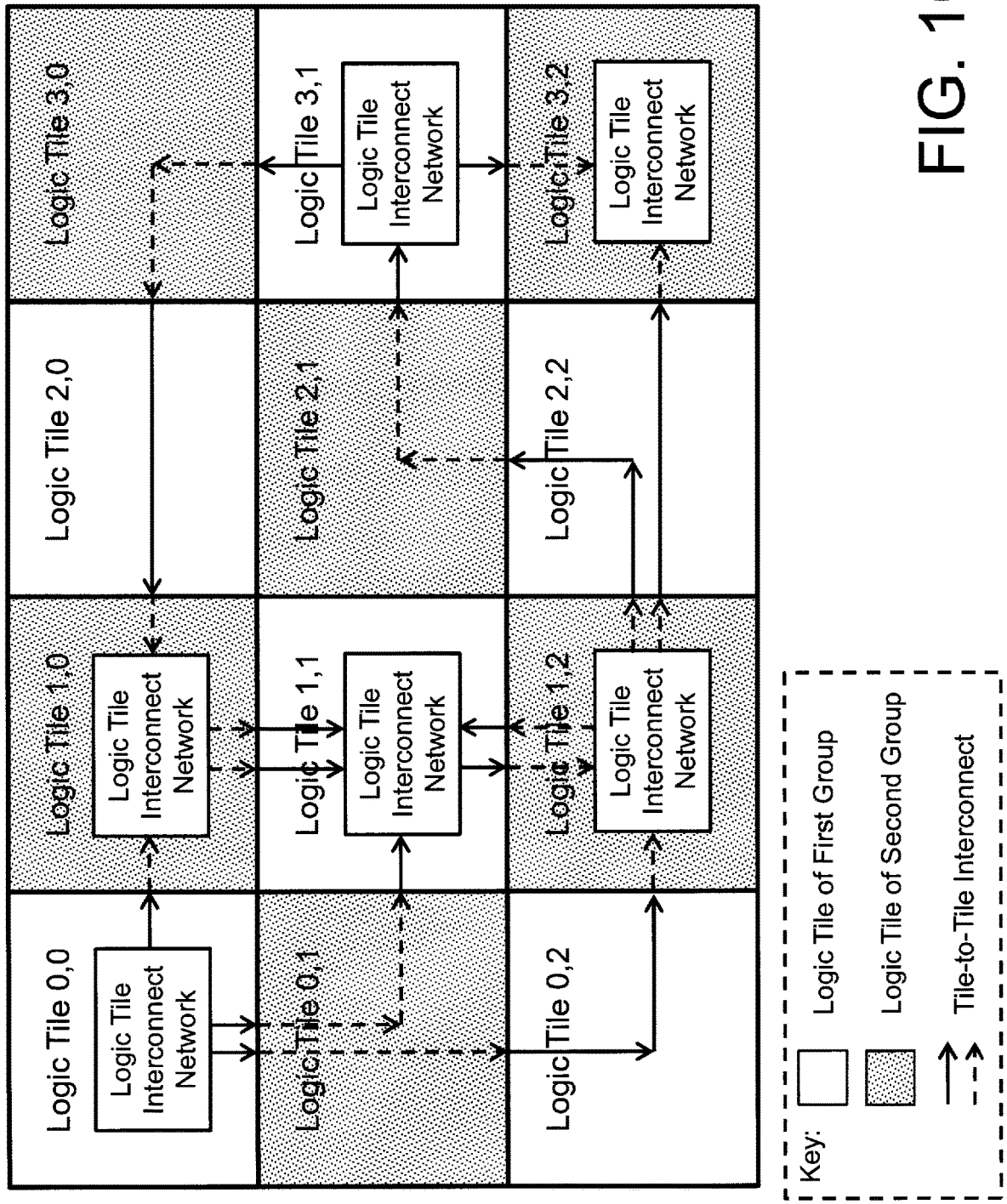

notably, in one embodiment, the tile-to-tile interconnects are connected to a mesh stage of the logic tile interconnect network of each logic tile (see, e.g., FIG. 2H) thereby forming a mesh interconnect network as the tile-to-tile interconnect network;

FIG. 4A is a flowchart of exemplary process of routing interconnects of the tile-to-tile interconnect network of an integrated circuit according to one or more of the inventions described and illustrated herein; for the avoidance of doubt, the inventions are not limited to processes and/or algorithms implemented in accordance with the flow chart of this figure; indeed, such flow chart is merely exemplary; and FIG. 4B is a flowchart of another exemplary process of routing interconnects of the tile-to-tile interconnect network wherein, for routing purposes, the plurality of logic tiles are organized into subsets or groups where the logic tiles of each subset or group of logic tiles include a start point of the routing of a partial interconnect path within each logic tile of the subset of logic tiles which is independent of/from other start point(s) of the routing of the partial interconnect path for other logic tiles of that subset of logic tiles; as noted above, the process of the flow charts are exemplary and the inventions are not limited to processes and/or algorithms implemented in accordance with such flow charts (for example, each subset or group of logic tiles could instead include an end point of the routing of a partial interconnect path, which is then associated with the start point of the other subset or group of logic tiles that are adjacent);

FIG. 4C illustrates, in block diagram form, a 3×4 exemplary array of logic tiles, where the logic tiles of a first subset or group of logic tiles are non-contiguous logic tiles of an array, and logic tiles of a second subset or group of logic tiles are non-contiguous logic tiles of an array (e.g., all logic tiles corresponding to the "unshaded" logic tiles of the array are a first subset or group of logic tiles and all logic tiles corresponding to the "shaded" logic tiles of the checkerboard pattern are the second subset or group of logic tiles)—wherein each logic tile of the first subset or group is independent of/from start/end point(s) of the other logic tiles of first subset or group, and, similarly, each logic tile of the second subset or group is independent of/from start/end point(s) of the other logic tiles of second subset or group; the start/end point(s) of the routing for, in or through each of the non-contiguous logic tiles are independent of each other; that is, the start/end point(s) of the routing of an interconnect path for, in or through each logic tile of the group of non-contiguous logic tiles (e.g., all logic tiles corresponding to the "black squares" of the checkerboard pattern) may be determined simultaneously and/or independently of the routing for that subset or group of logic tiles;

FIG. 5A illustrates, in block diagram form, a 3×4 exemplary array of logic tiles wherein a first portion of an exemplary process to route tile-to-tile interconnects of the tile-to-tile interconnect network of an exemplary route from the logic tile interconnect network of Logic Tile 0,0 (which may be connected to a computing element) to the logic tile interconnect network of Logic Tile 1,2 (which also may be connected to a computing element) according to one or more of the inventions; the routing in this exemplary embodiment includes routing the tile-to-tile interconnects of Logic Tile 0,0 and Logic Tile 0,2; in this exemplary illustration, Logic Tile 0,0, Logic Tile 2,0, Logic Tile 1,1, Logic Tile 3,1, Logic Tile 0,2 and Logic Tile 2,2 are a first subset or group of logic tiles and Logic Tile 1,0, Logic Tile 3,0, Logic Tile 0,1, Logic Tile 2,1, Logic Tile 1,2 and Logic Tile 3,2 are a second subset or group of logic tiles; the first subset or group of logic tiles is routed independently from the second subset or group of logic tiles, and vice versa; notably, the first portion of the routing includes (i) a tile-to-tile interconnect between a switch of the logic tile interconnect network of Logic Tile 0,0 to a switch of the logic tile interconnect network in Logic Tile 0,1, and (ii) a tile-to-tile interconnect from a switch of the logic tile interconnect network in Logic Tile 0,1, to/through/in one or more switches of the logic tile interconnect network of Logic Tile 0,2, to a tile-to-tile interconnect connecting to a switch of the logic tile interconnect network of Logic Tile 1,2; notably, for the purposes of clarity, only one interconnect path is illustrated in FIGS. 5A and 5B; however, in one embodiment, the routing technique of the present inventions provides for parallel and temporally concurrent routing, on a group/subset basis, of all interconnects of/in the tile-to-tile interconnect network for/in/though the logic tiles wherein many interconnects of the tile-to-tile interconnect network are routed to/through/in each logic tile to facilitate or provide programmed communication paths between logic tiles (e.g., between the computing elements (i.e., computing circuitry) or other circuitry thereof) of the FPGA (see, e.g., FIG. 2H);

FIG. 5B illustrates, in block diagram form, a second, subsequent portion (relative to the first portion) of an exemplary process to route tile-to-tile interconnects of the tile-to-tile interconnect network of an exemplary route from the logic tile interconnect network of Logic Tile 0,0 to the logic tile interconnect network of Logic Tile 1,2, according to one or more embodiments of the inventions, wherein the routing of the tile-to-tile interconnects includes Logic Tile 0,1 and Logic Tile 1,2; here, the route includes a starting point at a switch in the Logic Tile 0,1 (which was an end point resulting from the first portion of the routing, as illustrated in FIG. 5A), and in Logic Tile 0,2 also from a starting point at a switch in Logic Tile 1,2 (which was an end point resulting from the first portion of the routing, see FIG. 5A); the routing includes (i) an interconnect to, through and between Logic Tile 0,0 and Logic Tile 0,2, and (ii) an interconnect(s) to the logic tile interconnect network of Logic Tile 1,2;

FIGS. 6A-6D illustrate, in block diagram form, exemplary physical routes to/through/in Logic Tile 0,0 and Logic Tile 0,1 as implemented via the exemplary routing processes of FIGS. 5A and 5B, according to one or more embodiments of the inventions; in the illustrated embodiment of FIG. 6A, a mesh interconnect conductor is routed from switch x.N to switch y.N of the Nth stage of the logic tile interconnect network of Logic Tile 0,0 and, a tile-to-tile interconnect is routed from switch y.N of the Nth stage of the logic tile interconnect network of Logic Tile 0,0 to switch z.N of the logic tile interconnect network of Logic Tile 0,1, and to a switch (not illustrated) of the Nth stage of the logic tile interconnect network of Logic Tile 0,2; in the illustrated embodiment of FIG. 6B, a tile-to-tile interconnect is routed from switch y.N of the Nth stage of the logic tile interconnect network of Logic Tile 0,0 to switch y.N of the logic tile interconnect network of Logic Tile 0,1 to a switch z.N of the Nth stage of the logic tile interconnect network of Logic Tile 0,1; the routing also provides a tile-to-tile interconnect between switch z.N of the Nth stage of the logic tile interconnect network of Logic Tile 0,1 and a switch (not illustrated) in the Nth stage of the logic tile interconnect network of Logic Tile 0,2; in the illustrated embodiment of FIG. 6C, a tile-to-tile interconnect is routed from switch x.N of the Nth stage of the logic tile interconnect network of Logic Tile 0,0 to switch y.N of the logic tile interconnect network of Logic Tile 0,1; a mesh interconnect conductor provide connection to switch z.N of the Nth stage of the logic tile interconnect network of Logic Tile 0,1 and a tile-to-tile interconnect connects switch z.N to a switch (not illustrated) of the Nth stage of the logic tile interconnect network of Logic Tile 0,2; in the illustrated embodiment of FIG. 6D, a tile-to-tile interconnect is routed from switch x.N of the Nth stage of the logic tile interconnect network of Logic Tile 0,0 to switch z.N of the logic tile interconnect network of Logic Tile 0,1 and a tile-to-tile interconnect connects switch z.N to a switch (not illustrated) of the Nth stage of the logic tile interconnect network of Logic Tile 0,2;

FIGS. 7A and 7B illustrates, in block diagram form, a 3×4 exemplary array of logic tiles wherein a first portion of an exemplary process to route tile-to-tile interconnects of the tile-to-tile interconnect network of an exemplary route from the logic tile interconnect network of Logic Tile 0,0 (which may be connected to a computing element) to the logic tile interconnect network of Logic Tile 1,2 (which also may be connected to a computing element) and Logic Tile 3,1 (which also may be connected to a computing element via the logic tile interconnect network of Logic Tile 3,1) according to one or more of the inventions; again, in this exemplary illustration, Logic Tile 0,0, Logic Tile 2,0, Logic Tile 1,1, Logic Tile 3,1, Logic Tile 0,2 and Logic Tile 2,2 are a first subset or group of logic tiles and Logic Tile 1,0, Logic Tile 3,0, Logic Tile 0,1, Logic Tile 2,1, Logic Tile 1,2 and Logic Tile 3,2 are a second subset or group of logic tiles; wherein the first subset or group of logic tiles is routed independently from the second subset or group of logic tiles; as with the illustration in FIGS. 5A and 5B, for the purposes of clarity the illustrations in FIGS. 7A and 7B focus on a limited number of interconnect paths;

FIG. 7C illustrates, in block diagram form, exemplary physical routes to/through/in Logic Tile 1,1 and Logic Tile 1,2 and Logic Tile 2,1 as implemented via the exemplary routing processes of FIGS. 6A and 6B, according to one or more of the inventions; in the illustrated embodiment of FIG. 7A, a tile-to-tile interconnect is routed to switch a.N from a switch (not illustrated) in logic tile 0,1 (see route illustrated in FIG. 7B); mesh interconnect conductors are routed from switch a.N to switch b.N and to switch c.N of the Nth stage of the logic tile interconnect network of Logic Tile 1,1; a tile-to-tile interconnect is routed from switch b.N of the Nth stage of the logic tile interconnect network of Logic Tile 1,1 to switch d.N of the logic tile interconnect network of Logic Tile 2,1; in addition, a tile-to-tile interconnect is routed from switch c.N of the Nth stage of the logic tile interconnect network of Logic Tile 1,1 to switch e.N of the Nth stage of the logic tile interconnect network of Logic Tile 1,2; the switch e.N is interconnected to a computing element (e.g., an input and/or output of circuitry) via the hierarchical interconnect network of the logic tile interconnect network of Logic Tile 1,2;

FIGS. 8A and 8B illustrates, in block diagram form, a 3×4 exemplary array of logic tiles wherein a first portion of an exemplary process to route tile-to-tile interconnects of the tile-to-tile interconnect network of an exemplary route from the logic tile interconnect network of Logic Tile 0,0 (which may be connected to a computing element) to the logic tile interconnect network of Logic Tile 1,2 (which also may be connected to a computing element via the logic tile interconnect network of Logic Tile 1,2), Logic Tile 3,0 (which also may be connected to a computing element via the logic tile interconnect network of Logic Tile 3,0) and Logic Tile 3,2 (again, which also may include connection to a computing element therein via the logic tile interconnect network of Logic Tile 3,2) according to one or more of the inventions; again, in this exemplary illustration, Logic Tile 0,0, Logic Tile 2,0, Logic Tile 1,1, Logic Tile 3,1, Logic Tile 0,2 and Logic Tile 2,2 may be routed independently of Logic Tile 1,0, Logic Tile 3,0, Logic Tile 0,1, Logic Tile 2,1, Logic Tile 1,2 and Logic Tile 3,2; and FIGS. 9A-9D illustrates, in block diagram form, a 3×4 exemplary array of logic tiles wherein a first portion of an exemplary process to route tile-to-tile interconnects of the tile-to-tile interconnect network of an exemplary route from the logic tile interconnect network of Logic Tile 0,0 (which may be connected to circuitry of a computing element via the logic tile interconnect network of Logic Tile 0,0) to the logic tile interconnect network of Logic Tile 3,1 (which also may be connected to a computing element via the logic tile interconnect network of Logic Tile 3,1), according to one or more of the inventions; here, after routing tile-to-tile interconnects of a first process pertaining to Logic Tile 0,0, Logic Tile 1,1 and Logic Tile 3,1 (see FIG. 9A), it is determined in a second process that the intended route includes conflict, obstruction, impasse, congestion and/or the like and, as such, is not appropriate or suitable to route tile-to-tile interconnects through and including Logic Tile 2,1 (see FIG. 9B); in accordance with another aspect of the present inventions, after determining the initial path presented one or more portions having congestion, the interconnect path between a computing element in Logic Tile 0,0 and a computing element in Logic Tile 3,1 is re-routed (using the techniques described herein) as illustrated in FIGS. 9C and 9D wherein the re-routing processes includes re-routing the tile-to-tile interconnects and may include, if necessary or advantageous, the interconnects of the logic tile interconnect networks of Logic Tile 0,0 (to, for example, computing element therein via the logic tile interconnect network of Logic Tile 0,0) and/or Logic Tile 3,1 (to, for example, computing element therein via the logic tile interconnect network of Logic Tile 3,1);

FIG. 10A illustrates, in block diagram form, a 3×4 exemplary array of logic tiles wherein a first portion of an exemplary process to route tile-to-tile interconnects of the tile-to-tile interconnect network of an exemplary routes from/to/between the logic tile interconnect networks (which may be connected to a computing element) of the logic tiles, according to one or more of the inventions; in this exemplary illustration, Logic Tile 0,0, Logic Tile 2,0, Logic Tile 1,1, Logic Tile 3,1, Logic Tile 0,2 and Logic Tile 2,2 are a first subset or group of logic tiles and Logic Tile 1,0, Logic Tile 3,0, Logic Tile 0,1, Logic Tile 2,1, Logic Tile 1,2 and Logic Tile 3,2 are a second subset or group of logic tiles; the interconnects in/of/through the tile-to-tile interconnect network of the first subset or group of logic tiles is routed independently from interconnects in/of/through the tile-to-tile interconnect network of the second subset or group of logic tiles, and vice versa; notably, the first portion of the routing may include (i) a tile-to-tile interconnect between a switch of the logic tile interconnect network of various logic tiles to a switch of the logic tile interconnect network of another logic tile and/or (ii) a tile-to-tile interconnect from a switch of the logic tile interconnect network to/through/in one or more switches of the logic tile interconnect network of a logic tile to a tile-to-tile interconnect connecting to a switch of the logic tile interconnect network of another logic tile; notably, for the purposes of clarity, only a small number of interconnect paths is illustrated in FIGS. 10A and 10B; however, in one embodiment, the routing technique of the present inventions provides for parallel and temporally concurrent routing, on a group/subset basis, of all interconnects of/in the tile-to-tile interconnect network for/in/though the logic tiles wherein many interconnects of the tile-to-tile interconnect network are routed to/through/in each logic tile to facilitate or provide programmed communication paths between logic tiles (e.g., between the computing elements (i.e., computing circuitry) or other circuitry thereof) of the FPGA (see, e.g., FIG. 2H); and FIG. 10B illustrates, in block diagram form, a second, subsequent portion (relative to the first portion) of an exemplary process to route tile-to-tile interconnects of the tile-to-tile interconnect network of an exemplary route from/to/between the logic tile interconnect network of the logic tiles, according to one or more embodiments of the inventions; here, the route includes a starting point at a switch in one of the logic tile (which was an end point resulting from the first portion of the routing, as illustrated in FIG. 10A); the routing includes (i) interconnect(s) to, through and between logic tiles and/or (ii) interconnect(s) to the logic tile interconnect network of a logic tile; notably, the routing processes may include many, many more interconnects than those illustrates in FIGS. 10A and 10B—however, for the sake of clarity only a very few are illustrated in certain the logic tiles.

Again, there are many inventions described and illustrated herein. An embodiment or implementation described herein as "exemplary" is not to be construed as ideal, preferred or advantageous, relative to other embodiments or implementations; rather, it is intended reflect or indicate the embodiment(s) is/are "example" or "illustrative" embodiment(s). Indeed, these inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations/permutations are not discussed separately herein.

DETAILED DESCRIPTION

In a first aspect, the present inventions relate to a technique of routing of interconnects of the tile-to-tile interconnect network of an array or a plurality logic tiles of a field programmable gate array (FPGA) of an integrated circuit including disposed therein (e.g., an embedded FPGA), and method of manufacturing and operating such FPGA, to provide for and/or facilitate communications between circuitry in one or more (or all) of the logic tiles and circuitry in one or more (or all) other logic tiles (i.e., tile-to-tile communications). For example, in one embodiment, the FPGA includes a plurality of logic tiles each logic tile including one or more circuitry such as, for example, computing elements (e.g., processor circuit (e.g., a data process or digital signal processor), controller circuit, an accelerator, a data encryption engine, a filter, an encoder, a state machine and/or combinational logic circuit), and a logic tile interconnect network (e.g., a mixed-mode interconnect network (i.e., a hierarchical switch matrix interconnect network and a mesh interconnect network). The logic tile interconnect networks of a plurality of the logic tiles may be interconnected via tile-to-tile interconnects of a tile-to-tile interconnect network (e.g., a mesh interconnect network) wherein a plurality of tile-to-tile interconnects provide communications between, for example, the switch matrices of the logic tile interconnect networks of a plurality (or all) of the logic tiles of the FPGA. Here, the switches of the switch matrices are controlled or programmed to provide or implement a route by connecting a selected input of the switch to an output.

The routing processes or techniques of the present inventions may provide an accelerated, efficient and rapid manner of routing interconnects of the tile-to-tile interconnect network to establish or provide a desired interconnect architecture or layout of the tile-to-tile interconnect network to provide communications between circuitry (e.g., one or more computing elements) in one or more (or all) of the logic tiles and circuitry (e.g., one or more computing elements) in one or more (or all) other logic tiles (i.e., tile-to-tile communications) of the FPGA.

In addition thereto, the process or technique of the present inventions may further include processes or techniques for routing the interconnects within the logic tiles such that a more complete communication path is routed, for example, from circuitry (e.g., a computing element) in a first logic tile to, for example, circuitry (e.g., a computing element) in a second logic tile via the logic tile interconnect networks in each of the first and second logic tiles and the tile-to-tile interconnect network. In this way, the processes or techniques of the present inventions provides an "end-to-end" interconnect architecture or layout including connection of one or more computing elements (e.g., a data process or digital signal processor), controller circuit, a state machine and/or combinational logic circuit) to/through the respective logic tile interconnect networks of the first and second logic tiles as well as the tile-to-tile interconnect network disposed between and connecting the logic tile interconnect networks of the first and second logic tiles.

In one embodiment of the present inventions, the routing technique sequentially routes a plurality of partial interconnect paths of a complete interconnect path wherein each partial interconnect path is associated with a subset or group of logic tiles where the start/end point(s) of the routing of the tile-to-tile interconnects for, in or through each logic tile of the subset or group are independent of/from start/end point(s) of the routing for, in or through the other logic tiles of the same subset or group of logic tiles. For example, the logic tiles of a subset or group of logic tiles may be non-contiguous logic tiles of an array of logic tiles (e.g., all logic tiles corresponding to the "black squares" of a checkerboard pattern are a first subset or group of logic tiles and all logic tiles corresponding to the "red squares" of the checkerboard pattern are a second subset or group of logic tiles). The start/end point(s) of the routing for, in or through each of the non-contiguous logic tiles are independent of each other. That is, the start/end point(s) of the routing of an interconnect path for, in or through each logic tile of the group of non-contiguous logic tiles (e.g., all logic tiles corresponding to the "black squares" of the checkerboard pattern) may be determined simultaneously and/or independently of the routing for that subset or group of logic tiles.

The routing for, in or through logic tiles of subsets or groups of non-contiguous logic tiles, while independent of each other, may depend on the start/end point(s) of the routing for, in or through logic tiles of other subsets or groups (e.g., the start/end points of the routing pertaining to logic tiles corresponding to the "black squares" of the checkerboard pattern may depend on the start/end points of the routing for, in or through logic tiles corresponding to the "red squares"—which were previously routed). That is, a routing technique according to the present inventions may start with routing or determining a first partial interconnect path for a first group of logic tiles (i.e., a first subset—e.g., "red squares" of a checkerboard pattern) wherein the start/ end point(s) of the routing of the first partial interconnect path within each logic tile of the first group is independent from start/end point(s) of the routing of the first partial interconnect path for the other logic tiles of the first group. Thereafter, the routing technique of the present inventions route or determine a second partial interconnect path for a second group of logic tiles (i.e., a second subset—e.g., "black squares" of a checkerboard pattern) wherein the start point of the routing of the second partial interconnect path within each logic tile of the second group correlates or connects to the start/end point(s) of the first partial interconnect path routed in or through each of logic tile of the first group that is/are adjacent thereto. The start/end point(s) of the routing of the second partial interconnect path for, in or through each logic tile of the second group may be determined simultaneously and/or independently of the routing for, in or through each other logic tile of the second group. Here, however, as intimated above, start/end point(s) of the routing of the second partial interconnect path for the logic tiles of the second group may depend on the start/end point(s) of the first partial interconnect path routed in or through each of logic tile of the first group because the start/end point(s) of the routing of the second partial interconnect path for the logic tiles of the second group may connect to the interconnect path routed for, in or through logic tile(s) of the first group.

The processes of the present inventions may be repeated until the entire tile-to-tile interconnect path is completed, defined or routed for a given route between the plurality of logic tiles (i.e., all partial interconnect paths are routed wherein the plurality of partial interconnect paths, when interconnected (e.g., start points of the interconnects associated with the second group of logic tiles connect to endpoints of the interconnects associated with the first group of logic tiles), to form a complete tile-to-tile interconnect path between a plurality of logic tiles).

Notably, the interconnect path of the tile-to-tile interconnect network (which is routed in or through one or more logic tiles according to the present inventions) may include one or more switches of the tile-to-tile interconnect network and/or one or more switches of the logic tile interconnect network of each logic tile associated with or included in the interconnect path. For example, in one embodiment, the interconnect path of the tile-to-tile interconnect network may include one or more switches of a stage (for example, a mesh-type stage) of the logic tile interconnect network of each logic tile that provide or define the path in and between the various logic tiles. Thus, in addition to tile-to-tile interconnects, the interconnect path includes the one or more switches of the tile-to-tile interconnect network of each logic tile associated with or included in the tile-to-tile interconnect network relating to that tile-to-tile interconnect path or route.

The present inventions may be employed to define, program, route and/or configure each of the tile-to-tile interconnects of one or more (or all) of the logic tiles of an FPGA, in parallel or sequentially. Moreover, the present inventions may be employed to define, program, route and/or configure the entire interconnect path in an end-to-end manner including, for example, between circuitry (e.g., a computing element) in a first logic tile (via the associated logic tile interconnect network of the first logic tile) and circuitry (e.g., a computing element) in a second logic tile (via the associated logic tile interconnect network of the second logic tile) through the tile-to-tile interconnects of the tile-to-tile interconnect network that provides or defines the tile-to-tile path through, in and/or between the logic tiles of the FPGA.

In one embodiment, in the event of conflict or congestion of or in a given routing of the tile-to-tile interconnect path, the technique may include one or more re-route steps which re-route(s) previously routed partial interconnect paths and repeats one or more earlier routing steps (described above) for any portions of the partial interconnect path that, for example, has conflict or congestion (e.g., (i) do not include interconnect between logic tiles or in one or more logic tiles that provide or allow the entire interconnect path to be sufficiently routed for a given route between logic tiles without any other interconnect path occupy any of the same routing resources, and/or (ii) a defined route is not efficient or in accordance with/to specification(s) (e.g., signal timing specifications).

As mentioned above, the routing process of the present inventions may program, route and/or configure the tile-to-tile interconnects for one or more (or all) of the logic tiles sequentially or in parallel using the techniques of the present inventions. Moreover, in one embodiment, the routing processes of the present inventions may, in parallel or sequentially, program, route and/or configure all interconnects associated with one logic tile, a plurality of logic tiles or all of the logic tiles. For example, the routing processes, as described herein, to define or route interconnect paths between circuitry (e.g., computing elements) of logic tiles (including the tile-to-tile interconnects and the logic tile interconnects associated with such circuitry (e.g., computing elements)) may be implemented sequentially or in parallel on a tile basis or a circuitry (e.g., computing element) basis.

With reference to FIG. 1A-1D, an FPGA includes, among other things, a plurality of logic tiles (e.g., arranged in an array of rows and columns) wherein each logic tile includes circuitry (e.g., one or more computing elements (e.g., processor circuit (e.g., a data process or digital signal processor), controller circuit, an accelerator, a data encryption engine, a filter, an encoder, a state machine and/or combinational logic circuit)), and a logic tile interconnect network of configurable switches and interconnects that facilitate communication within the logic tile. The FPGA also includes a tile-to-tile interconnect network (e.g., a mesh-type interconnect network) having tile-to-tile interconnects that connect the logic tile interconnect network of each logic tile thereby providing communication between the logic tiles (e.g., selectively configurable communications between circuitry in the various logic tiles). (See, e.g., FIG. 1C). In one embodiment, the logic tiles include a plurality of switch matrices (e.g., an M×N switch matrix) arranged in a plurality of switch matrix stages or switch matrices stages (referred to or identified below and in the drawings, at times, as "SM stage" or "SM stages") which are interconnected into a logic tile interconnect network via logic tile interconnects. (See, for example, FIG. 1D—see also, e.g., the interconnect networks described and/or illustrated in U.S. Pat. No. 9,503,092, which is incorporated herein by reference). As such, logic tiles are configurable to communicate, during operation of the integrated circuit, between circuitry (e.g., computing elements) within the logic tile as well as with, for example, circuitry, of at least one other logic tile of the FPGA. (See, e.g., FIGS. 1C and 1D).

Notably, as stated above, the integrated circuit may be, for example, a discrete or embedded processor, controller, state machine, gate array, SOC, PGA and/or FPGA.

With reference to FIGS. 2A and 2B, in one embodiment, the logic tile interconnect network may be a hierarchal interconnect including a plurality of switch matrix stages (Stages 1, 2 . . . N) interconnected via hierarchy conductors or interconnects—albeit detailed interconnections between switch matrices of each stage in FIG. 2A have been eliminated for purposes clarity. The plurality of switch matrix stages may be arranged or configured in one or more that radix interconnects. For example, in one embodiment, plurality of switch matrix stages are configured in two or more different radix or boundary-less radix interconnects. The mixed-radix interconnect architecture include hierarchy conductors or interconnects to connect the switch matrices and computing elements.

For example, with reference to FIG. 2B, in one exemplary embodiment, it may be advantageous to employ a radix-4 interconnect (Stage 1), in comparison to radix-2 (R2) interconnects, in order to reduce the switching time (which may provide in a faster network) because a radix-4 (R4) requires ½ the number of switch matrix (SM) Stages to communicate between four computing elements (CEs)—that is, a radix-4 interconnect network requires one switch matrix (SM) Stage (compared to two switch matrix (SM) Stages in the context of a radix-2 interconnect). This may be balanced against the fact that a radix-4 interconnect requires more wiring resources.

With reference to FIGS. 2C-2E, in one embodiment, the logic tile interconnect network may be a mixed-mode interconnect architecture wherein (i) the switch matrices of at least one switch stage are configured in a hierarchical network (in relation to the switch stages of the other switch matrices and/or computing elements) and (ii) the switch matrices of at least one stage are configured in a mesh network (wherein the outputs of switches of the stage are organized as a mesh such that the outputs are routed to inputs of selected other switches of the same stage). Again, detailed interconnections between switch matrices of the stages have been eliminated for purposes clarity.

In the exemplary mixed-mode interconnect architectures of the logic tile interconnect network, switch matrices of at least one stage are configured in a hierarchical network (in relation to the switch stages of the other switch matrices and/or computing elements) and switch matrices of at least one stage are configured in a mesh network. For example, in FIG. 2C, switch matrices of Stages 1 and 2 are configured in a hierarchical architecture and switch matrices of Stage N are configured in a mesh architecture wherein, as a mesh architecture (and unlike a hierarchical architecture), the outputs of the switches of Stage N are routed to selected other switches of Stage N—that is, the output routing provides direct connection to and remains within Stage N (see, FIG. 2C wherein the signal travels between switches 1.N and 9.N, and thereafter the signal may travel within the other Stages connected to the mesh network—e.g., to the CE by entering the hierarchical network via Stage N−1 by way of a switch of Stage N) (see also, FIG. 2D wherein switch matrices of Stage 2 are configured in a mesh architecture and, as such, the signal travels between switches 1.2 and 9.2, and thereafter the signal may travel within the other Stages connected to the mesh network via the hierarchical network of Stages 9.x . . . 9.N,—e.g., to one or more computing elements by entering the hierarchical network via Stage 1 or Stage 3 by way of a switch of Stage 2).

Notably, mesh interconnects may be implemented in more than one stage of a logic tile. With reference to FIG. 2D, switch matrices of Stage 1 is configured in a hierarchical architecture (and other Stages may as well) and switch matrices of Stage 2 and Stage N are configured in a mesh architecture wherein, as a mesh architecture (and unlike a hierarchical architecture), the outputs of the switches of Stages 2 and N are routed to selected other switches of Stages 2 and N, respectively—that is, the output routing provides direct connection to and remains within Stage 2 and Stage N, respectively. Again, for the purposes of clarity, much of the detailed interconnections between switch matrices of the stages have been eliminated. The switch matrices of Stage 3 through Stage M may be configured in a hierarchical architecture (e.g., one or more radix and/or boundary-less radix organizations) or a mesh network architecture (i.e., a mesh, torus or the like network architecture).

With reference to FIGS. 2F and 2G, in one exemplary embodiment, the logic tile interconnect network includes has a hierarchical network for the lower stages (lower stages are those stages that are disposed, positioned or located closer to the circuitry (e.g., computing elements "CE") within the interconnect architecture—see Stages 1, 2 and 3) and a mesh interconnect network is implemented for the highest stage (see Stage 4). Notably, a key difference for mesh-type architecture is that a signal does not change hierarchy when traversing between switch matrices; that is, the signal may be transmitted to other switches within the switch matrices (SM) of Stage 4. In a hierarchical network, the signal would travel from CE to the required switch matrix hierarchy, and then travel back down. In the hierarchical-type architecture, the signal generally does not travel within the same hierarchy—in contrast to a mesh-type architecture. In the mesh interconnect configuration of Stage 4, when a signal travels from/to switch 1.4 to/from switch 9.4, it remains within switch matrices of the same stage (i.e., Stage 4); thereafter, the signal can then travel somewhere else on the mesh network, or travel downwards towards a computing element connection (for example, CE3) by entering, for example, the switch 3.4 and then propagate within the hierarchical network via Stage 3 (e.g., switches 3.3, 3.2, 3.1 to CE3).

With reference to FIG. 2H, in one exemplary embodiment, the logic tile interconnect networks of Logic Tile A and Logic Tile B connect via tile-to-tile interconnects that connect switches of a stage (here, switches of Stage 4) of the logic tile interconnect network of Logic Tile A to switches of a stage (here again, switches of Stage 4) of the logic tile interconnect network of Logic Tile B. In this exemplary embodiment, the tile-to-tile interconnects of the tile-to-tile interconnect network are mesh interconnects wherein a signal output by one or more switches of Stage 4 propagate through the mesh interconnects of the associated logic tile interconnect network and through the tile-to-tile interconnects of the tile-to-tile interconnect network to one or more switches of Stage 4 of the logic tile interconnect network of the adjacent logic tile. Here, the switches of the logic tile interconnect networks of the adjacent logic tiles are connected via mesh interconnects of the tile-to-tile interconnect network. That is, in this exemplary embodiment, switches of Stage 4 of the logic tile interconnect network of Logic Tile A connect to switches of Stage 4 of the logic tile interconnect network of Logic Tile B (i.e., the adjacent logic tile)—and vice versa. For example, switch 1.4 of Logic Tile A is routed to connect to switch 1.4 of Logic Tile B (among others) via a tile-to-tile interconnect and, in addition, is routed to connect to switch 9.4 of Logic Tile A (among others). Similarly, switch 3.4 of Logic Tile A is routed to connect to switch 3.4 of Logic Tile B via a tile-to-tile interconnect and, in addition, is routed to connect to switch 11.4 of Logic Tile A (among others). Notably, the same is the case for the same switches in Logic Tile B (i.e., switch 1.4 of Logic Tile B is routed to connect to switch 9.4 of Logic Tile B (among others)—in addition to connecting to switch 1.4 of Logic Tile A via a tile-to-tile interconnect; and switch 3.4 of Logic Tile B is routed to connect to switch 11.4 of Logic Tile B via a logic tile interconnect and, in addition, is routed to connect to switch 3.4 of Logic Tile A via a tile-to-tile interconnect).

With continued reference to FIG. 2H, where a partial interconnect path of the tile-to-tile interconnect network is disposed in or through Logic Tile A (e.g., enters/exits from Side x of Logic Tile A and exits/enters from Side y), the partial interconnect path may include one or more switches of Stage 4 of the logic tile interconnect network of Logic Tile A and one or more logic tile interconnect of the logic tile interconnect network of Logic Tile A. For example, the partial interconnect path may include tile-to-tile interconnect TT1 which is disposed between the logic tile (not illustrated) adjacent to Side y of Logic Tile A and connects to the switch 16.4. A logic tile interconnect LT1 is connected between switch 16.4 and switch 8.4 of Stage 4 of the logic tile interconnect network of Logic Tile A. A tile-to-tile interconnect TT2 is connected to switch 8.4 of Stage 4 of the logic tile interconnect network of Logic Tile A and a switch of Stage 4 of the logic tile (not illustrated) adjacent to Side x of Logic Tile A. In this exemplary interconnect, a partial interconnect path "spans" Logic Tile A and connects to a logic tile disposed adjacent Side x and a second logic tile disposed adjacent to Side y (both adjacent logic tiles not illustrated).

Figure 3A:
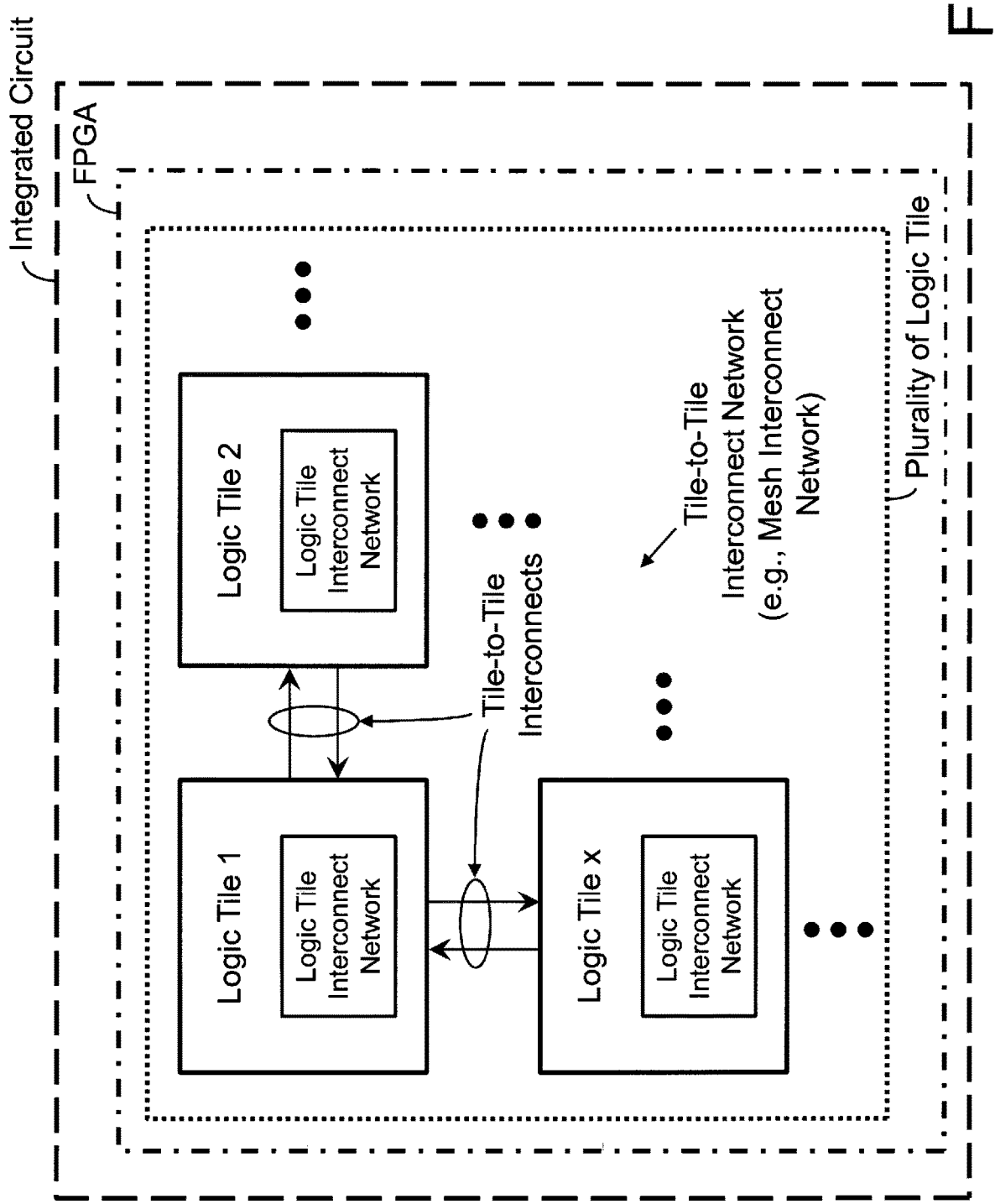
FIG. 3A illustrates a block diagram representation of an exemplary integrated circuit including an FPGA having a plurality of logic tiles (each of which may include transistors configured to perform combinational and/or sequential functions (simple and/or complex) and a logic tile interconnect network (i.e., a plurality of multiplexers electrically interconnected into a network (see, e.g., FIGS. 2A-2H and the interconnect networks described and/or illustrated in U.S. Pat. No. 9,503,092))) wherein logic tile interconnect network of one or more (or all) logic tiles are interconnected to the logic tile interconnect networks of one or more other logic tiles of the plurality of logic tiles via tile-to-tile interconnects that form a tile-to-tile interconnect network which facilitates communication between the logic tiles of the programmable/configurable logic circuitry; notably, in one embodiment, the tile-to-tile interconnects are connected to a mesh stage of the logic tile interconnect network of a plurality (or all) logic tiles (see, e.g., FIG. 2H) thereby forming a mesh interconnect network as the tile-to-tile interconnect network for the plurality (or all) of the logic tiles; such mesh stage may be the highest stage of the logic tile interconnect network (see, e.g., FIGS. 2C, 2E and 2H) or may be an intermediate stage (see, e.g., FIGS. 2D and 2E); indeed, in one embodiment, the tile-to-tile interconnect network may incorporate or include a plurality of stages of the logic tile interconnect network wherein the tile-to-tile interconnects connect a plurality of logic tiles via a plurality of stages of the logic tile interconnect network.
Figure 3B:
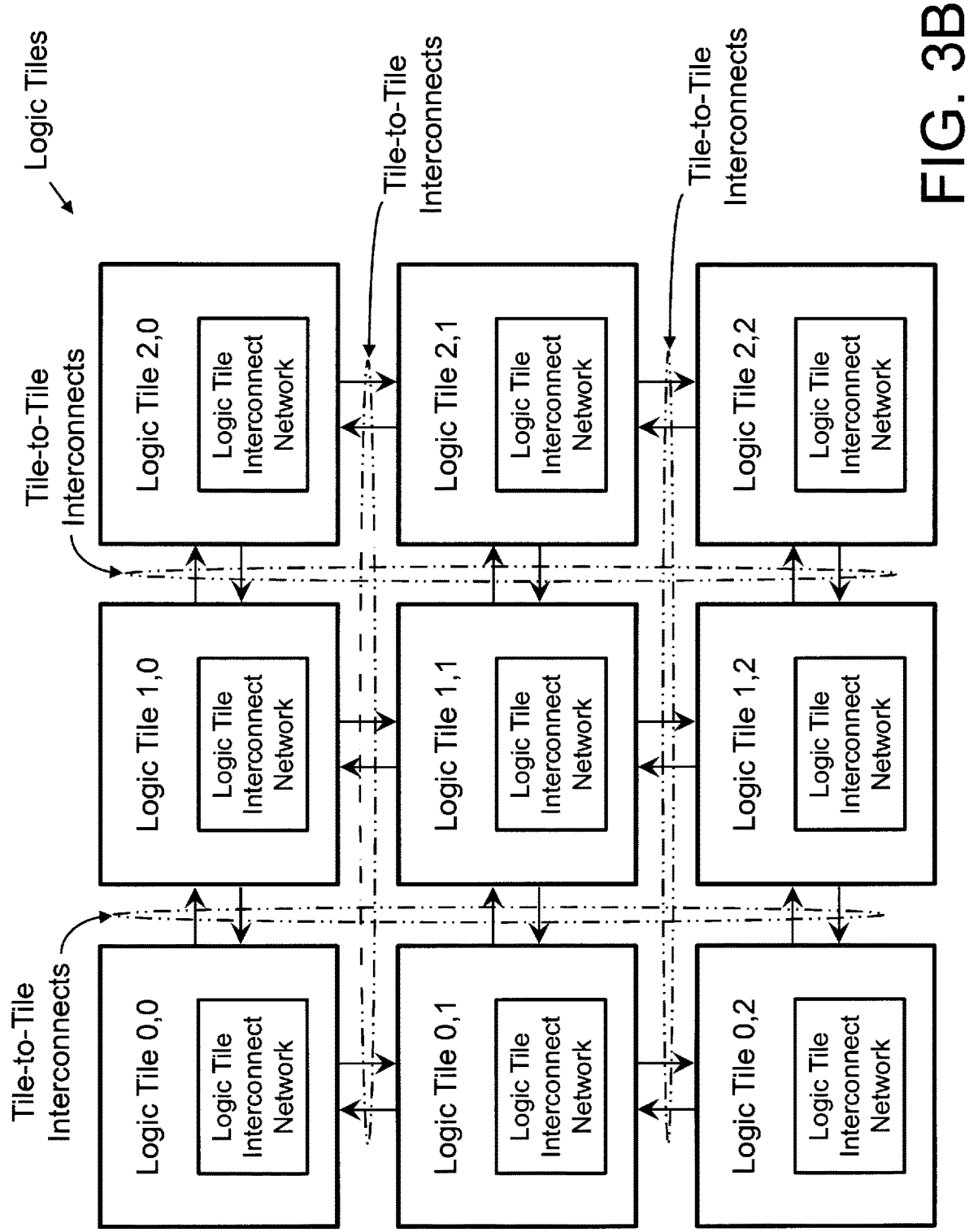
FIG. 3B illustrates a 3×3 array of logic tiles wherein the logic tile interconnect network of each logic tile of the array is interconnected to the logic tile interconnect networks of one or more (or all) logic tiles via tile-to-tile interconnects which facilitates communication between the logic tiles.

With reference to FIGS. 3A and 3B, in one exemplary embodiment, each logic tile includes a logic tile interconnect network (e.g., a mixed-mode network having one or more hierarchical stages (each stage including a plurality of switches or multiplexers—hereinafter collectively "switches" or "multiplexers") and one or more mesh stages (each stage also including a plurality of switches or multiplexers)). The logic tiles, in this embodiment, are physically arranged in an array of rows and columns. The logic tile interconnect network of each logic tile is interconnected to the logic tile interconnect networks of one or more other logic tiles of the plurality of logic tiles via tile-to-tile interconnects that form a tile-to-tile interconnect network which facilitates communication between the logic tiles of the programmable/configurable logic circuitry of the FPGA (e.g., an embedded FPGA). In one embodiment, the tile-to-tile interconnects are connected to a mesh interconnect stage of the logic tile interconnect network of each logic tile (see, e.g., FIG. 2H) thereby forming a mesh interconnect network as the tile-to-tile interconnect network (i.e., a mesh-type tile-to-tile interconnect network). In one embodiment, the tile-to-tile interconnects of the mesh-type tile-to-tile interconnect network connect the highest stage of the logic tile interconnect network of each logic tile (see, e.g., FIGS. 2C, 2E and 2H). In another embodiment, the tile-to-tile interconnects of the mesh-type tile-to-tile interconnect network connect an intermediate stage of the logic tile interconnect network of each logic tile (see, e.g., FIGS. 2D and 2E). Indeed, in one embodiment, the tile-to-tile interconnects of the mesh-type tile-to-tile interconnect network may directly interconnect a plurality of stages of the logic tile interconnect network wherein the tile-to-tile interconnects directly connect to a plurality of stages of each logic tile interconnect network of logic tiles (see, e.g., FIG. 2E)—thereby directly interconnecting two or more stages of logic tile interconnect network of each logic tile wherein each stage is directly connected into a separate and distinct mesh-type tile-to-tile interconnect network.

As noted above, the logic tile interconnects and tile-to-tile interconnects provide a predetermined or defined route or connection by controlling or programming the switches of the respective networks. Here, one or more control signals having predetermined data states are applied to the control inputs of the switch or multiplexer to select and/or determine or define which input is connected to the output of the switch. The data corresponding to the control signals applied to the switches to control or program the input selection (i.e., which input of the switch is connected to the output) may be stored in memory, for example, in the logic tile or external thereto.

With reference to FIGS. 4A and 4B, in one exemplary embodiment of a process according to the present inventions, the tile-to-tile interconnects of the tile-to-tile interconnect network corresponding to subsets of logic tiles are routed in parallel. For example, in one embodiment, the logic tiles are organized into multiple subsets or groups, for routing purposes, where routing technique sequentially routes, on a subset/group by subset/group basis, partial interconnects associated with each logic tile of the same subset or group of logic tiles. The logic tiles of each subset or group of logic tiles include an independent start/end point of the routing of the tile-to-tile interconnects corresponding to each logic tile of the same subset or group. That is, the start/end point(s) of the routing of the tile-to-tile interconnects for, in or through each of the logic tiles of the subset or group are independent of/from start/end point(s) of the routing for, in or through the other logic tiles of the same subset or group of logic tiles.

From a routing processes perspective, a group of non-contiguous logic tiles provide an independent start/end point(s). For example, with reference to FIG. 4C, where the logic tiles of a subset or group of logic tiles are non-contiguous logic tiles of an array, each of the logic tiles of the subset or group is independent of/from start/end point(s) (e.g., the logic tiles corresponding to the "unshaded" logic tiles of the array are a first subset or group of logic tiles and the logic tiles corresponding to the "shaded" logic tiles of the checkerboard pattern are a second subset or group of logic tiles—albeit more than two subsets or groups may be implemented, employed or included in the processes of the present inventions (e.g., the logic tiles of the first and/or second subsets or groups may be assigned and/or allocated into different subset(s) or group(s))). The start/end point(s) of the routing for, in or through each of the non-contiguous logic tiles are independent of each other. That is, the start/end point(s) of the routing of an interconnect path for, in or through each logic tile of the group of non-contiguous logic tiles (e.g., all logic tiles corresponding to the "black squares" of the checkerboard pattern) may be determined simultaneously and/or independently of the routing for that subset or group of logic tiles.

With reference to FIGS. 4A-4C, 5A and 5B, the inventive routing techniques, in one embodiment, includes a first step wherein a first group partial interconnect paths for/in/though a first group of logic tiles are routed independently and in parallel (i.e., temporally at the same time or about the same time—for example, using different microprocessors). Here, the start/end points of the routing of the first partial interconnect paths for/in/though each logic tile of the first group are independent from other start/end point(s) of the routing of the first partial interconnect path associated with the other logic tiles of the first group. For example, with specific reference to FIG. 5A, where an interconnect path is to be established between Logic Tile 0,0 and Logic Tile 1,2, a first group of partial interconnect path may be routed, defined or programmed for/in/though Logic Tile 0,0 and Logic Tile 0,2. Here, these partial interconnect paths are routed independently and in parallel (i.e., simultaneously/concurrently or substantially simultaneously/concurrently). This provides parallel routing of, for example, the tile-to-tile interconnects for/in/through each of the tiles of the first group. Moreover, although not illustrated here, each of the logic tiles will include many, many interconnects and, as such, the routing processes will include many, many more interconnects than those illustrates in FIGS. 5A and 5B—however, for the sake of clarity of the explanation of this embodiment of the inventions, only one route is illustrated.

After routing the first group partial interconnect paths associated with the first group of logic tiles (i.e., Logic Tile 0,0 and Logic Tile 0,2), a second of partial interconnect paths for/in/though a second group of logic tiles (i.e., Logic Tile 0,1 and Logic Tile 1,2) may be routed independently and in parallel. (See, FIG. 5B). The start/end point(s) of the routing of the second partial interconnect path for/in/though each logic tile of the second group (i.e., the interconnect paths indicated in dotted lines) connect to the associated end of the first group interconnect paths (i.e., the interconnect paths indicated in solid lines) routed within each of the logic tiles of the first group (i.e., Logic Tile 0,0 and Logic Tile 0,2) of a route that is/are adjacent to the logic tile(s) of the second group (i.e., Logic Tile 0,1 and Logic Tile 1,2).

Notably, the process or technique according to at least one embodiment of the present inventions may further include processes or techniques for routing the interconnects within the logic tile interconnect network of the logic tiles such that a more complete communication path is routed from a computing element in first logic tile (in the exemplary illustration of FIGS. 5A and 5B, Logic Tile 0,0) to a computing element in a second logic tile (i.e., Logic Tile 1,2) via the logic tile interconnect networks in each of the first and second logic tiles and the tile-to-tile interconnect network (i.e., the interconnect path formed in/through Logic Tile 0,0, Logic Tile 0,1, Logic Tile 0,2 and Logic Tile 1,2. In this way, the processes or techniques of the present inventions provides an "end-to-end" interconnect architecture or layout including connection of one or more computing elements (e.g., a data process or digital signal processor), controller circuit, a state machine and/or combinational logic circuit) to/through the respective logic tile interconnect networks of the first and second logic tiles as well as the tile-to-tile interconnect network disposed between and connecting the logic tile interconnect networks of the first and second logic tiles.

Importantly, as mentioned above, for the purposes of clarity in describing the techniques of the present inventions, exemplary routing of only one specific interconnect path is described in connection with and illustrated in FIGS. 5A and 5B. This is also applicable to the illustrations in FIGS. 6A-9D. The routing technique of the present inventions includes parallel and concurrent (or substantially concurrent) routing, on a group/subset basis, of a plurality of or all interconnects of/in the tile-to-tile interconnect network for/in/though the logic tiles. Each logic tile may include many, many interconnects of the tile-to-tile interconnect network to facilitate or provide programmed communication paths between logic tiles (e.g., between the computing elements thereof) of the FPGA. (See, e.g., FIG. 2H).

With continued reference to FIGS. 5A and 5B, tile-to-tile interconnect network connecting and providing a communication path between Logic Tile 0,0 and Logic Tile 1,2—via Logic Tile 0,1 and Logic Tile 0,2—includes tile-to-tile interconnects, switches of one or more stages of the logic tile interconnect networks of such logic tiles, and logic tile interconnects associated with such switches. For example, with further reference to FIGS. 6A-6D, in one embodiment, Computing Element x connects to one or more stages of the logic tile interconnect network of Logic Tile 0,0 to Switch x.N of Stage N. In this exemplary embodiment, the switches of Stage N are organized/interconnected in a mesh-type interconnect network wherein a signal output by Switch x.N of Stage N may connect to another switch of Stage N of the Logic Tile 0,0 before propagating through a tile-to-tile interconnect of the tile-to-tile interconnect network to one or more switches of Stage N of the logic tile interconnect network of another logic tile (e.g., in this illustration, Logic Tile 0,1). In this exemplary embodiment, the tile-to-tile interconnects of the tile-to-tile interconnect network are mesh interconnects wherein a signal output by one or more switches of Stage N propagate in/through the mesh interconnects of the associated logic tile interconnect network (of Logic Tile 0,0 and in/through the tile-to-tile interconnect(s) of the tile-to-tile interconnect network to one or more switches of Stage N of the logic tile interconnect network of the Logic Tile 0,1). Here, switch(es) of logic tile interconnect network of Logic Tile 0,1 (e.g., Switch y.N and Switch z.N in FIG. 6B) provide the interconnect path in/though Logic Tile 0,1. Thus, a partial interconnect path of the tile-to-tile interconnect network includes tile-to-tile interconnects, logic tile interconnects and one or more switches of the logic tile interconnect network of each of Logic Tile 0,0 and 0,1 (see FIGS. 6A-6D). Notably, although not illustrated, the same is the case for Logic Tile 0,2 and Logic Tile 1,2—that is, partial interconnect path of the tile-to-tile interconnect network includes tile-to-tile interconnects, logic tile interconnects and switches of Stage N of the logic tile interconnect network of Logic Tile 0,2 and Logic Tile 1,2.

With reference to FIGS. 7A and 7B, in one embodiment, the tile-to-tile interconnects may be routed according to the present inventions to provide an interconnect path including two or more outputs or inputs in/through one or more logic tiles. Here, in a first step a first group partial interconnect paths for/in/though a first group of logic tiles (i.e., Logic Tile 0,0, Logic Tile 1,1 and Logic Tile 3,1) may be routed independently and in parallel (i.e., concurrently or substantially concurrently). The start/end points of the routing of the first partial interconnect paths for/in/though each (non-contiguous) logic tile of the first group are independent from other start/end point(s) of the routing of the first partial interconnect path associated with the other logic tiles of the first group. After routing partial interconnect paths for/in/though Logic Tile 0,0, Logic Tile 1,1 and Logic Tile 3,1, the technique routes partial interconnect paths for/in/though Logic Tile 0,1, Logic Tile 1,2 and Logic Tile 2,1. (See, FIG. 7B). These partial interconnect paths may also be routed independently and concurrently (or substantially concurrently) relative to each other—starting from the start/end points defined by the first group partial interconnect paths for/in/though a first group of logic tiles. In each instance, tile-to-tile interconnects connect from one or more switches of a logic tile interconnect of a logic tile (e.g., Logic Tile 1,1) to a switch of a logic tile interconnect of one or more adjacent logic tiles (e.g., Logic Tile 1,2 and Logic Tile 2,1). (See, FIG. 7B). Where, as in other exemplary embodiments the tile-to-tile interconnects of the tile-to-tile interconnect network are mesh interconnects of a mesh interconnect network, the interconnect paths for/in/though the tile-to-tile interconnect network would be like that or similar to that described in connection with FIGS. 6A-6D.

Notably, the plurality of interconnect paths for/in/though Logic Tile 1,1 may be routed/provided via multiple switches in the logic tile interconnect network of Logic Tile 1,1. With reference to FIG. 7C, in one embodiment, a switch (i.e., Switch a.N) in Stage N of the logic tile interconnect network of Logic Tile 1,1 is routed to a tile-to-tile interconnect disposed between and connected to a switch (not illustrated) in Logic Tile 0,1 (not illustrated). The Switch a.N is connected to Switch b.N and Switch c.N via mesh conductors. The Switch b.N connects to a tile-to-tile interconnect that is disposed between Logic Tile 1,1 and Logic Tile 2,1 and the Switch c.N connects to a tile-to-tile interconnect that is disposed between Logic Tile 1,1 and Logic Tile 1,2. In one embodiment, Switch e.N is routed through the hierarchical interconnect network of the logic tile interconnect network of Logic Tile 1,2 to circuitry (e.g., a computing element) therein. In this embodiment, a more complete communication path is routed from circuitry in a Logic Tile 0,0 to circuitry in a Logic Tile 1,2 via the associated logic tile interconnect networks and the tile-to-tile interconnect network.

With reference to FIGS. 8A and 8B, the routing, using the techniques of the present inventions, may include routing interconnects from one or more circuitry (e.g., computing element(s)) of/in one Logic Tile to one or more circuitry (e.g., computing elements) of/in a plurality of logic tiles. For example, the routing techniques of the present inventions may route or program interconnects, using the techniques of the present inventions, to routing a communication path from a computing element connected to the logic tile interconnect network of Logic Tile 0,0 to logic tile interconnect networks of Logic Tile 1,2, Logic Tile 3,0 and Logic Tile 3,2. Logic tile interconnects of the logic tile interconnect networks of Logic Tile 1,2, Logic Tile 3,0 and Logic Tile 3,2 may be routed, using the techniques of the present inventions, to computing elements in those logic tiles. Again, the number of interconnect paths routed in the illustration of FIGS. 8A and 8B are limited for purposes of clarity in order to illustrate and clearly explain certain features of or relating to the present inventions. Each logic tile will likely include many interconnects of the tile-to-tile interconnect network and logic tile interconnect network to facilitate or provide programmed communication paths between logic tiles (e.g., between circuitry thereof) of the FPGA. (See, e.g., FIGS. 2F-2H).

With reference to FIGS. 4B, 9A-9D, in certain instances, an intended route may include conflict or congestion that prohibits or precludes implementation of a partial route or renders insufficient a partial route (for example, fails to meet design-rule requirement of no more than 1 unique signal per routing resource, and/or fails to meet timing specifications). Under these circumstances, the routing technique may re-route a portion or the entire route by repeating the routing techniques with a different path that avoids the congestion. For example, a first portion of an exemplary process may route tile-to-tile interconnects of the tile-to-tile interconnect network of an exemplary route from the logic tile interconnect network of Logic Tile 0,0 (which may be connected to a computing element) to the logic tile interconnect network of Logic Tile 3,1 (which also may be connected to a computing element), according to one or more of the inventions. Here, after routing tile-to-tile interconnects of a first process pertaining to Logic Tile 0,0, Logic Tile 1,1 and Logic Tile 3,1 (see FIG. 9A), it is determined in a second process that the intended route includes congestion and, as such, it is unable, inappropriate or unsuitable to route tile-to-tile interconnects for/in/through and including Logic Tile 2,1 (see FIG. 9B).

Under these circumstances, after determining the initial path presented one or more portions having congestion, the interconnect path between a computing element in Logic Tile 0,0 and a computing element in Logic Tile 3,1 is re-routed (using the techniques described herein) as illustrated in FIGS. 9C and 9D wherein the re-routing processes includes re-routing the tile-to-tile interconnects and may include, if necessary or advantageous, the interconnects of the logic tile interconnect networks of Logic Tile (to, for example, computing element therein) and/or Logic Tile 3,1 (to, for example, computing element therein). Again, the number of interconnect paths illustrated in FIGS. 9A-9D are limited for purposes of clarity in order to illustrate and clearly explain certain features of or relating to the present inventions (here addressing routing congestion or conflicts).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

The routing processes or techniques of the present inventions may provide an accelerated, efficient and rapid manner of routing interconnects of the tile-to-tile interconnect network to establish or provide a desired interconnect architecture or layout of the tile-to-tile interconnect network to provide communications between one or more computing elements in one or more (or all) of the logic tiles and one or more computing elements in one or more (or all) other logic tiles (i.e., tile-to-tile communications) of the FPGA. Notably, connecting to or connecting from one or more switches of a logic tile (e.g., via a tile-to-tile interconnect) to one or more switches of another logic tile or the same logic tile may be connecting to or connecting from an input(s) of the switch(es) and/or an output(s) of the switch(es).

As noted above, in describing and illustrating certain aspects of the present inventions, certain drawings have been simplified for the purposes of clarity in order to describe, focus, highlight and/or illustrate certain aspects of the circuitry and the techniques of the present inventions. For example, the exemplary routing in each of the plurality of subsets or groups of logic tiles will include many, many interconnects albeit only one or a few interconnect paths are described and illustrated. (See, e.g., FIGS. 5A, 5B, 10A and 10B. This is also applicable to the illustrations in FIGS. 6A-9D. The routing technique of the present inventions includes parallel and concurrent (or substantially concurrent) routing, on a group/subset basis, of a plurality of or all interconnects of/in the tile-to-tile interconnect network for/in/though the logic tiles. Each logic tile will likely include many interconnects of the tile-to-tile interconnect network and logic tile interconnect network to facilitate or provide programmed communication paths between logic tiles (e.g., between circuitry thereof) of the FPGA.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

Notably, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Further, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, in the claims and elsewhere, the term "logic tile" means a design unit or block of a plurality of transistors (typically more than thousands), which, in this application, is capable of connecting to one or more neighboring logic tiles, logic cells, logic cores or logic blocks. The term "integrated circuit" means, among other things, a processor, controller, state machine, gate array, SOC, PGA and/or FPGA. The term "integrated circuit" also means, for example, a processor, controller, state machine and SoC— including an embedded FPGA. For the avoidance of doubt, field programmable gate array or FPGA means both an FPGA and an embedded FPGA.

In addition, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

Further, the term "switch" means multiplexer and/or switch. The term "start/end point" means either a start point of an interconnect or an end point of an interconnect. The term "in parallel" means concurrently or substantially concurrently.

What is claimed is:

1. A method of routing interconnects of an integrated circuit comprising a field programmable gate array including: (i) a plurality of logic tiles, wherein each logic tile includes a logic tile interconnect network having a plurality of switches and a plurality of logic tile interconnects, (ii) a tile-to-tile interconnect network, having a plurality of tile-to-tile interconnects, each having start/end points, to interconnect logic tile networks of the plurality of logic tiles, the method comprising:
routing a first plurality of tile-to-tile interconnects in a first plurality of logic tiles wherein: (i) the first plurality of logic tiles are a first subset of the plurality of logic tiles and (ii) the start/end point of each tile-to-tile interconnect in the first plurality of logic tiles is independent of the start/end point of the other tile-to-tile interconnects in the first plurality of logic tiles;
after routing the first plurality of tile-to-tile interconnects, routing a second plurality of tile-to-tile interconnects in a second plurality of logic tiles wherein: (i) the second plurality of logic tiles are a second subset of the plurality of logic tiles and (ii) the start/end point of each tile-to-tile interconnect in the second plurality of logic tiles is independent of the start/end point of the other tile-to-tile interconnects in the second plurality of logic tiles; and
wherein routing the second plurality of tile-to-tile interconnects in the second plurality of logic tiles includes connecting at least one start/end point of each tile-to-tile interconnect in the second plurality of logic tiles to at least one start/end point of each tile-to-tile interconnect in the first plurality of logic tiles that was routed in the first plurality of logic tiles.

2. The method of claim 1 further including:
routing the first plurality of tile-to-tile interconnects in the first plurality of logic tiles in parallel.

3. The method of claim 1 further including:
routing the logic tile interconnects of each logic tile of the plurality of logic tiles.

4. The method of claim 3 wherein:
routing the logic tile interconnects of each logic tile of the plurality of logic tiles includes programming switches of the logic tile interconnect network of each logic tile of the plurality of logic tiles.

5. The method of claim 4 wherein:
routing the logic tile interconnects of each logic tile of the plurality of logic tiles further includes programming switches of the logic tile interconnect network of each logic tile of the plurality of logic tiles to connect to one or more inputs/outputs of a computing elements.

6. The method of claim 1 further including:
after routing the first plurality of tile-to-tile interconnects in the first plurality of logic tiles in parallel, routing the second plurality of tile-to-tile interconnects in the second plurality of logic tiles in parallel.

7. The method of claim 1 wherein:
routing the first plurality of tile-to-tile interconnects of each logic tile of the first plurality of logic tiles includes programming one or more switches of the logic tile interconnect network of each logic tile of the first plurality of logic tiles that are connected to at least one of the first plurality of tile-to-tile interconnects, and
routing the second plurality of tile-to-tile interconnects of each logic tile of the second plurality of logic tiles includes programming one or more switches of the logic tile interconnect network of each logic tile of the second plurality of logic tiles that are connected to at least one of the second plurality of tile-to-tile interconnects.

8. The method of claim 1 wherein:
each logic tile of the first plurality of logic tiles is non-contiguous relative to the other logic tile of the first plurality of logic tiles, and
each logic tile of the second plurality of logic tiles is non-contiguous relative to the other logic tile of the second plurality of logic tiles.

9. The method of claim 1 further including:
routing the logic tile interconnects of each logic tile of the plurality of logic tiles by programming switches of the logic tile interconnect network of each logic tile of the plurality of logic tiles, wherein:
routing the logic tile interconnects of each logic tile of the plurality of logic tiles includes routing logic tile interconnects of a plurality of stages including at least one hierarchical stage and at least one mesh stage.

10. The method of claim 9 wherein:
routing the first tile-to-tile interconnects and second plurality of tile-to-tile interconnects include routing the first and second plurality of tile-to-tile interconnects into a mesh network.

11. A method of routing interconnects of an integrated circuit comprising a field programmable gate array including: (i) a first plurality of non-contiguous logic tiles, wherein each logic tile of the first plurality of logic tiles includes a logic tile interconnect network having a plurality of switches and a plurality of logic tile interconnects, (ii) a second plurality of non-contiguous logic tiles, wherein each logic tile of the second plurality of logic tiles includes a logic tile interconnect network having a plurality of switches and a plurality of logic tile interconnects, and (iii) a tile-to-tile interconnect network, having a plurality of tile-to-tile interconnects, each tile-to-tile interconnect having start/end points to interconnect the logic tile networks of the first plurality of logic tiles and the second plurality of logic tiles, the method comprising:
routing a first plurality of tile-to-tile interconnects in the first plurality of non-contiguous logic tiles in parallel, wherein the start/end point of each tile-to-tile interconnect in the first plurality of non-contiguous logic tiles is independent of the start/end point of the other tile-to-tile interconnects in the first plurality of non-contiguous logic tiles;
after routing the first plurality of tile-to-tile interconnects in a first plurality of non-contiguous logic tiles, routing a second plurality of tile-to-tile interconnects in the second plurality of non-contiguous logic tiles in parallel, wherein the start/end point of each tile-to-tile interconnect in the second plurality of logic tiles is independent of the start/end point of the other tile-to-tile interconnects in the second plurality of non-contiguous logic tiles; and wherein routing the second plurality of tile-to-tile interconnects in the second plurality of non-contiguous logic tiles includes connecting at least one start/end point of each tile-to-tile interconnect in the second plurality of non-contiguous logic tiles to at least one start/end point of each tile-to-tile interconnect in the first plurality of non-contiguous logic tiles that was routed in the first plurality of non-contiguous logic tiles.

12. The method of claim 11 wherein:
each logic tile of the first plurality of non-contiguous logic tiles is contiguous to at least one logic tile of the second plurality of non-contiguous logic tiles and vice versa.

13. The method of claim 11 further including:
routing the logic tile interconnects of each logic tile of the first plurality of non-contiguous logic tiles, and
routing the logic tile interconnects of each logic tile of the second plurality of non-contiguous logic tiles.

14. The method of claim 11 further including:
routing the logic tile interconnects of each logic tile of the plurality of logic tiles by programming switches of the logic tile interconnect network of each logic tile of the plurality of logic tiles, wherein:
routing the logic tile interconnects of each logic tile of the first and second plurality of non-contiguous logic tiles includes routing logic tile interconnects of a plurality of stages including at least one hierarchical stage and at least one mesh stage, and
routing the first tile-to-tile interconnects and second plurality of tile-to-tile interconnects include routing the first and second plurality of tile-to-tile interconnects into a mesh network.

15. The method of claim 11 wherein:
routing the first plurality of tile-to-tile interconnects of each logic tile of the first plurality of non-contiguous logic tiles includes programming one or more switches of the logic tile interconnect network of each logic tile of the first plurality of logic tiles that are connected to at least one of the first plurality of tile-to-tile interconnects, and
routing the second plurality of tile-to-tile interconnects of each logic tile of the second plurality of non-contiguous logic tiles includes programming one or more switches of the logic tile interconnect network of each logic tile of the second plurality of logic tiles that are connected to at least one of the second plurality of tile-to-tile interconnects.

16. The method of claim 15 further including:
routing the logic tile interconnects of each logic tile of the first and second plurality of non-contiguous logic tiles and wherein:
routing the logic tile interconnects of each logic tile of the plurality of logic tiles includes programming switches of the logic tile interconnect network of each logic tile of the plurality of logic tiles.

17. The method of claim 16 wherein:
routing the logic tile interconnects of each logic tile of the plurality of logic tiles further includes programming switches of the logic tile interconnect network of each logic tile of the first and second plurality of non-contiguous logic tiles to connect to one or more inputs/outputs of a computing elements.

18. A method of routing interconnects of an integrated circuit comprising a field programmable gate array including: (i) a first plurality of non-contiguous logic tiles, wherein each logic tile of the first plurality of logic tiles includes a logic tile interconnect network having a plurality of switches and a plurality of logic tile interconnects, (ii) a second plurality of non-contiguous logic tiles, wherein each logic tile of the second plurality of logic tiles includes a logic tile interconnect network having a plurality of switches and a plurality of logic tile interconnects, and (iii) a tile-to-tile interconnect network, having a plurality of tile-to-tile interconnects, each tile-to-tile interconnect having start/end points to interconnect the logic tile networks of the first plurality of logic tiles and the second plurality of logic tiles, the method comprising:
routing a first plurality of tile-to-tile interconnects in the first plurality of non-contiguous logic tiles, wherein the start/end point of each tile-to-tile interconnect in the first plurality of non-contiguous logic tiles is independent of the start/end point of the other tile-to-tile interconnects in the first plurality of non-contiguous logic tiles, wherein a portion of the first plurality of tile-to-tile interconnects in the first plurality of non-contiguous logic tiles are routed sequentially;
after routing the first plurality of tile-to-tile interconnects in a first plurality of non-contiguous logic tiles, routing a second plurality of tile-to-tile interconnects in the second plurality of non-contiguous logic tiles, wherein the start/end point of each tile-to-tile interconnect in the second plurality of logic tiles is independent of the start/end point of the other tile-to-tile interconnects in the second plurality of non-contiguous logic tiles, wherein a portion of the second plurality of tile-to-tile interconnects in the second plurality of non-contiguous logic tiles are routed sequentially; and
wherein routing the second plurality of tile-to-tile interconnects in the second plurality of non-contiguous logic tiles includes connecting at least one start/end point of each tile-to-tile interconnect in the second plurality of non-contiguous logic tiles to at least one start/end point of each tile-to-tile interconnect in the first plurality of non-contiguous logic tiles that was routed in the first plurality of non-contiguous logic tiles.

19. The method of claim 18 wherein:
each logic tile of the first plurality of non-contiguous logic tiles is contiguous to at least one logic tile of the second plurality of non-contiguous logic tiles.

20. The method of claim 18 further including:
routing the logic tile interconnects of each logic tile of the plurality of logic tiles by programming switches of the logic tile interconnect network of each logic tile of the plurality of logic tiles, wherein:
routing the logic tile interconnects of each logic tile of the first and second plurality of non-contiguous logic tiles includes routing logic tile interconnects of a plurality of stages including at least one hierarchical stage and at least one mesh stage, and
routing the first tile-to-tile interconnects and second plurality of tile-to-tile interconnects include routing the first and second plurality of tile-to-tile interconnects into a mesh network.

* * * * *